(12) United States Patent
Yao et al.

(10) Patent No.: US 11,652,054 B2
(45) Date of Patent: May 16, 2023

(54) DIELECTRIC ON WIRE STRUCTURE TO INCREASE PROCESSING WINDOW FOR OVERLYING VIA

(71) Applicant: Taiwan Semiconductor Manufacturing Co., Ltd., Hsin-Chu (TW)

(72) Inventors: Hsin-Chieh Yao, Hsinchu (TW); Chung-Ju Lee, Hsinchu (TW); Chih Wei Lu, Hsinchu (TW); Hsi-Wen Tien, Xinfeng Township (TW); Yu-Teng Dai, New Taipei (TW); Wei-Hao Liao, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 56 days.

(21) Appl. No.: 17/236,234

(22) Filed: Apr. 21, 2021

(65) Prior Publication Data
US 2022/0344264 A1  Oct. 27, 2022

(51) Int. Cl.
*H01L 23/535* (2006.01)
*H01L 21/768* (2006.01)

(52) U.S. Cl.
CPC ...... *H01L 23/535* (2013.01); *H01L 21/76802* (2013.01); *H01L 21/76805* (2013.01); *H01L 21/76895* (2013.01)

(58) Field of Classification Search
CPC ............ H01L 23/535; H01L 21/76895; H01L 21/79805; H01L 21/76802
See application file for complete search history.

(56) References Cited

U.S. PATENT DOCUMENTS

| 6,287,979 B1 | 9/2001 | Zhou |
| 7,329,613 B2 | 2/2008 | Furukawa |
| 9,281,277 B2 | 3/2016 | Baek |
| 9,390,965 B2 | 7/2016 | Yang et al. |
| 2008/0182403 A1 | 7/2008 | Noori |
| 2009/0093100 A1 | 4/2009 | Xia |

(Continued)

OTHER PUBLICATIONS

Stine et al. "Formation of Primary Amines on Silicon Nitride Surfaces: A Direct, Plasma-Based Pathway to Functionalization." Langmuir 2007, 23, 4400-4404, published Feb. 27, 2007.
Raphael et al. "Surface Modification and Grafting of Carbon Fibers: A Route to Better Interface." Progress in Crystal Growth and Characterization of Materials 64 (2018) 75-101, published Jul. 25, 2018.

(Continued)

*Primary Examiner* — Shahed Ahmed
*Assistant Examiner* — Vicki B. Booker
(74) *Attorney, Agent, or Firm* — Eschweiler & Potashnik, LLC

(57) ABSTRACT

In some embodiments, the present disclosure relates to an integrated chip that includes a first interconnect dielectric layer over a substrate. An interconnect wire extends through the first interconnect dielectric layer, and a dielectric on wire structure is arranged directly over the interconnect wire. Outer sidewalls of the dielectric on wire structure are surrounded by the first interconnect dielectric layer. The integrated chip further includes a second interconnect dielectric layer arranged over the first interconnect dielectric layer, and an interconnect via that extends through the second interconnect dielectric layer and the dielectric on wire structure to contact the interconnect wire.

20 Claims, 15 Drawing Sheets

(56) References Cited

U.S. PATENT DOCUMENTS

| | | | |
|---|---|---|---|
| 2009/0152736 A1* | 6/2009 | Watanabe | H01L 21/76864 257/E23.173 |
| 2009/0302475 A1 | 12/2009 | Korogi | |
| 2010/0001409 A1 | 1/2010 | Humbert | |
| 2010/0093168 A1 | 4/2010 | Naik | |
| 2012/0261788 A1 | 10/2012 | Lin | |
| 2015/0179582 A1 | 6/2015 | Baek | |
| 2015/0287682 A1 | 10/2015 | Ahn | |
| 2016/0293547 A1 | 10/2016 | Rha | |
| 2016/0379871 A1 | 12/2016 | Tsai et al. | |
| 2017/0278796 A1 | 9/2017 | Briggs | |
| 2020/0098688 A1* | 3/2020 | Shi | H01L 21/28568 |
| 2020/0258772 A1 | 8/2020 | Hsieh | |
| 2020/0411427 A1 | 12/2020 | Lin | |
| 2021/0043498 A1 | 2/2021 | Lai | |

OTHER PUBLICATIONS

Mackus et al. "From the Bottom-Up: Toward Area-Selective Atomic Layer Deposition with High Selectivity." Chem. Mater. 2019, 31, 2-12, published on Dec. 19, 2018.
Lapedus, Mark. "Where Is Selective Deposition?" Semiconductor Engineering, published on Jun. 25, 2018.
U.S. Appl. No. 16/923,424, filed Jul. 8, 2020.
U.S. Appl. No. 16/898,705, filed Jun. 11, 2020.
U.S. Appl. No. 17/355,613, filed Jun. 23, 2021.
Non-Final Office Action dated Aug. 25, 2021 in connection with U.S. Appl. No. 16/923,424.
Non-Final Office Action dated Aug. 27, 2021 in connection with U.S. Appl. No. 16/898,705.
Notice of Allowance dated Dec. 9, 2021 in connection with U.S. Appl. No. 16/898,705.

* cited by examiner

DIELECTRIC ON WIRE STRUCTURE TO INCREASE PROCESSING WINDOW FOR OVERLYING VIA

BACKGROUND

As dimensions and feature sizes of semiconductor integrated circuits (ICs) are scaled down, the density of the elements forming the ICs is increased and the spacing between elements is reduced. Such spacing reductions are limited by light diffraction of photolithography, mask alignment, isolation and device performance among other factors. As the distance between any two adjacent conductive features decreases, the resulting capacitance increases, which will increase power consumption and time delay. Thus, manufacturing techniques and device design are being investigated to reduce IC size while maintaining or improving performance of the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
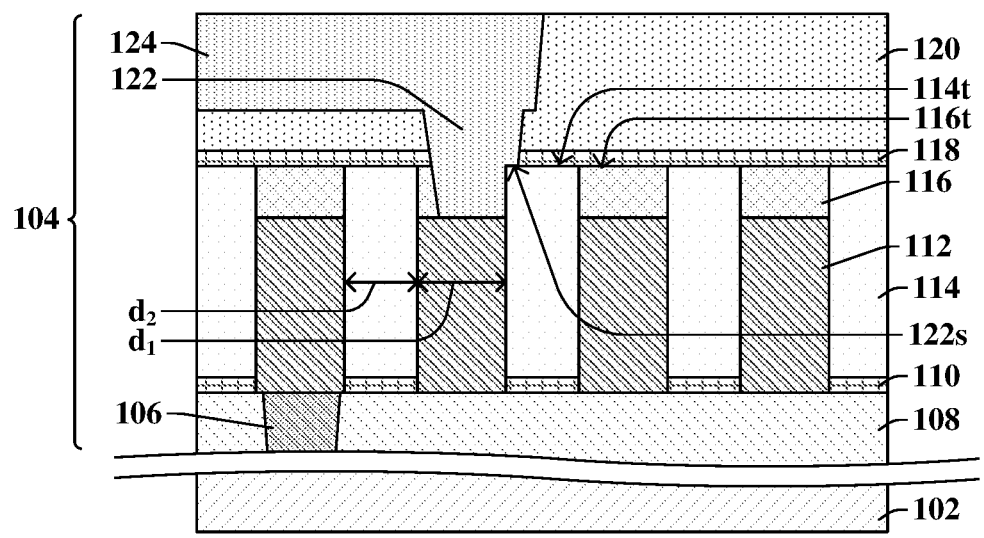
FIG. 1A illustrates a cross-sectional view of some embodiments of an integrated chip having a dielectric on wire structure arranged over a first interconnect wire, wherein an interconnect via extends through the dielectric on wire structure to contact the first interconnect wire.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips may include a number of semiconductor devices (e.g., transistors, inductors, capacitors, etc.) and/or memory devices disposed over and/or within a semiconductor substrate. An interconnect structure may be disposed over the semiconductor substrate and coupled to the semiconductor devices. The interconnect structure may include conductive interconnect layers having interconnect wires and interconnect vias within an interconnect dielectric structure. The interconnect wires and/or interconnect vias provide electrical pathways between different semiconductor devices disposed within and/or over the semiconductor substrate.

Some embodiments of an interconnect structure include first interconnect wires coupled to an underlying semiconductor device, and an interconnect via is arranged over and coupled to one of the first interconnect wires. During manufacturing, the first interconnect wires embedded within a first interconnect dielectric layer may be formed. Then, a second interconnect dielectric layer may be deposited over the first interconnect dielectric layer and the first interconnect wires. A cavity may be formed within the second interconnect dielectric layer using photolithography and removal processes to expose a top surface of one of the first interconnect wires. Then, a conductive material may be formed within the cavity to form an interconnect via coupled to the one of the first interconnect wires.

However, as the size of the integrated chips decrease, the first interconnect wires and spacing between the first interconnect wires decrease, and forming the cavity that is centered directly over the one of the first interconnect wires becomes more difficult due processing limitations. Some examples of such processing limitations include precision/accuracy of overlaying a masking structure for photolithography that is directly centered on the one of the first interconnect wires and/or achieving a small enough opening in the masking structure corresponding to the one of the interconnect wires that is used for the formation of the cavity. In some cases, if the cavity is not centered over the one of the first interconnect wires, the cavity may be partially formed over the first interconnect dielectric layer. In such embodiments, the removal process used to form the cavity may remove a portion of the first interconnect dielectric layer. In such embodiments, a portion of the interconnect via in the final structure may be arranged directly between adjacent ones of the first interconnect wires, which may increase capacitance and/or reduce the time of the first interconnect dielectric layer to breakdown between the adjacent ones of the first interconnect wires, thereby reducing the reliability of the overall integrated chip.

Various embodiments of the present disclosure relate to the formation of dielectric over wire structures arranged on top surfaces of the first interconnect wires in an interconnect structure. The dielectric on wire structures have outer sidewalls surrounded by the first interconnect dielectric layer and comprise a different material than the first interconnect dielectric layer. After the dielectric on wire structures are formed, the second interconnect dielectric layer may be formed over the first interconnect dielectric layer. Then, photolithography and removal process may be performed to form a cavity that extends through the second interconnect dielectric layer and one of the dielectric on wire structures to expose an upper surface of one of the first interconnect wires. In some embodiments, an etchant may be used to remove portions of the one of the dielectric on wire structures. In some embodiments, the first interconnect dielectric layer may be substantially resistant to removal by the etchant.

Thus, in some embodiments, even if the cavity is formed directly over a portion of the first interconnect dielectric layer due to processing limitations, the etching selectivity between the first interconnect dielectric layer and the dielectric on wire structure prevents the cavity from extending into the first interconnect dielectric layer. Therefore, the resulting interconnect via formed within the cavity is not arranged directly between adjacent ones of the first interconnect wires. Thus, the processing window for forming the interconnect via is increased while isolation between the adjacent ones of the first interconnect wires is maintained, thereby reducing cross-talk and increasing reliability of the overall integrated chip.

FIG. 1A illustrates a cross-sectional view 100A of some embodiments of an integrated chip comprising an interconnect via extending through a dielectric on wire structure to contact a first interconnect wire.

The integrated chip of FIG. 1A includes an interconnect structure 104 arranged over a substrate 102. In some embodiments, the interconnect structure 104 comprise a lower interconnect via 106, first interconnect wires 112 arranged over and coupled to the lower interconnect via 106, an interconnect via 122 arranged over and coupled to one of the first interconnect wires 112, and a second interconnect wire 124 arranged over and coupled to the interconnect via 122. In some embodiments, the interconnect structure 104 may further comprise a lower interconnect dielectric layer 108 surrounding the lower interconnect via 106, a first interconnect dielectric layer 114 surrounding the first interconnect wires 112, and a second interconnect dielectric layer 120 surrounding the interconnect via 122 and/or second interconnect wire 124. In some embodiments, a first etch stop layer 110 may be arranged over the lower interconnect dielectric layer 108 and between the lower interconnect dielectric layer 108 and the first interconnect dielectric layer 114. In some embodiments, a second etch stop layer 118 may be arranged over the first interconnect dielectric layer 114 and arranged between the first interconnect dielectric layer 114 and the second interconnect dielectric layer 120.

Further, in some embodiments, the interconnect structure 104 may be coupled to one or more semiconductor devices (e.g., transistors, inductors, capacitors, etc.) and/or memory devices (not shown) disposed over and/or within the substrate 102. Thus, the conductive features (e.g., lower interconnect via 106, first interconnect wires 112, interconnect via 122, second interconnect wire 124) of the interconnect structure 104 may be electrically coupled to one another and to any underlying or overlying devices (not shown) to provide a conductive pathway for signals (e.g., voltage, current) traveling through the integrated chip.

In some embodiments, the first interconnect wires 112 each have a width equal to a first distance $d_1$ in a range of between, for example, approximately 5 nanometers and approximately 1000 nanometers. Further, in some embodiments, a first interconnect wire 112 may be spaced apart from an adjacent first interconnect wire 112 by a second distance $d_2$. In some embodiments, the second distance $d_2$ may be in a range of between, for example, approximately 5 nanometers and approximately 1000 nanometers. In some embodiments, the first interconnect wires 112 are embedded within the first interconnect dielectric layer 114 such that the first interconnect wires 112 are spaced apart from one another by the first interconnect dielectric layer 114. In some embodiments, the first interconnect dielectric layer 114 comprises a low-k dielectric material such as, for example, silicon carbide, silicon dioxide, silicon oxygen carbide, silicon nitride, silicon carbon nitride, silicon oxynitride, silicon oxygen carbon nitride, or some other suitable dielectric material. The low-k dielectric material of the first interconnect dielectric layer 114 and/or any other isolation structures (e.g., other dielectric layers, air spacer structures, etc.) arranged laterally between the first interconnect wires 112 reduce capacitance and prevent cross-talk between adjacent ones of the first interconnect wires 112.

In some embodiments, a dielectric on wire structure 116 is arranged over each first interconnect wire 112. In some embodiments, the dielectric on wire structure 116 may also have a width equal to the first distance $d_1$, and the dielectric on wire structure 116 may have a bottom surface that completely and directly overlies a top surface of the first interconnect wire 112. In some embodiments, the dielectric on wire structure 116 is laterally surrounded by the first interconnect dielectric layer 114. In some embodiments, the dielectric on wire structures 116 have topmost surfaces 116t that are substantially coplanar with topmost surfaces 114t of the first interconnect dielectric layer 114. In some embodiments, the dielectric on wire structure 116 comprises, for example, hafnium oxide, lithium niobium oxide, lithium nitrogen oxide, magnesium oxide, manganese oxide, molybdenum oxide, niobium oxide, nitrogen oxide, silicon oxide, silicon oxygen carbide, silicon oxygen carbon nitride, silicon oxynitride, silicon carbide, tin oxide, tin silicon oxide, strontium oxide, tantalum oxide, tantalum oxynitride, titanium oxide, titanium oxynitride, tungsten oxide, zinc oxide, zirconium oxide, or some other suitable dielectric material or metal-oxide.

In some embodiments, the interconnect via 122 extends from the second interconnect wire 124 and through the second interconnect dielectric layer 120 and the dielectric on wire structure 116 to directly contact the first interconnect wire 112. In some embodiments, because the first distance $d_1$ of the first interconnect wires 112 and the second distance $d_2$ between the first interconnect wires 112 are so small (e.g., between about 5 nanometers and about 1000 nanometers), forming the interconnect via 122 to land directly on the first interconnect wire 112 is more difficult due to processing limitations. For example, in some embodiments, during the formation of the interconnect via 122, a masking structure comprising an opening may be formed over the second interconnect dielectric layer 120. In some embodiments, due to processing (e.g., photolithography) limitations during the formation of the masking structure, the opening may directly overlie the first interconnect wire 112 and also a portion of the first interconnect dielectric layer 114. Then, in some embodiments, an etchant may be used to remove portions of the dielectric on wire structure 116 arranged directly below the opening of the masking structure to form a cavity that exposes the first interconnect wire 112. In some embodiments, the first interconnect dielectric layer 114 comprises a different material than the dielectric on wire structure 116, and the first interconnect dielectric layer 114 is substantially resistant to removal by the etchant used to remove the dielectric on wire structure 116. In such embodiments, the interconnect via 122 that is formed within the cavity may have a horizontal surface 122s that directly extends over and contacts the topmost surface 114t of the first interconnect dielectric layer 114.

Thus, in some embodiments, even if a portion of the opening of the masking structure used to form the interconnect via 122 is arranged directly over the first interconnect dielectric layer 114, the first interconnect dielectric layer 114 may not be removed during the formation of the interconnect via 122. As a result, the interconnect via 122 does not extend below an upper surface of the first interconnect wire 112 and is not arranged directly between adjacent ones of the first interconnect wires 112. Thus, at least due to the dielectric on wire structures 116, isolation between the adjacent ones of the first interconnect wires 112 provided by the first interconnect dielectric layer 114 may be maintained during the formation of the interconnect via 122, thereby reducing cross-talk between the adjacent ones of the first interconnect wires 112 and maintaining and/or increasing device reliability.

Figure 1B:
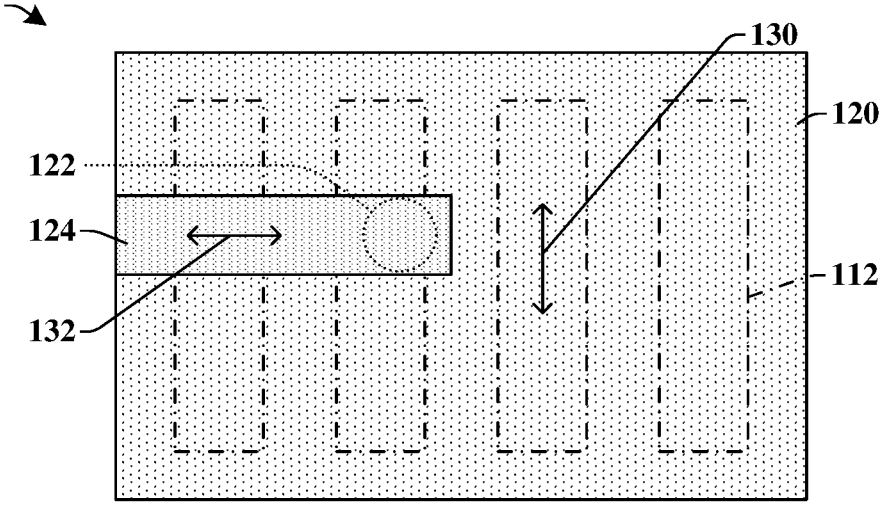
FIG. 1B illustrates a top-view of some embodiments corresponding to FIG. 1A.

FIG. 1B illustrates a top-view 100B of some embodiments corresponding to a top-view of FIG. 1A.

In some embodiments, from the top-view 100B, the first interconnect wires 112 are arranged beneath the second interconnect dielectric layer 120, and thus, the first interconnect wires 112 are illustrated using a dot-dash line. Similarly, in some embodiments, from the top-view 100B, the interconnect via 122 is arranged beneath the second interconnect wire 124, and thus, the interconnect via 122 is illustrated using a dotted line. In some embodiments, the first interconnect wires 112 extend in a first direction 130, and the second interconnect wire 124 extends in a second direction 132. In some embodiments, the first direction 130 is different than the second direction 132, and the first direction 130 is perpendicular to the second direction 132. In some embodiments, the dielectric on wire structures (116 of FIG. 1A) increase the processing window of the interconnect via 122 at least in the second direction 132.

In some embodiments, the interconnect via 122 couples one of the first interconnect wires 112 to the second interconnect wire 124. In some embodiments, it will be appreciated that from the top-view 100B, although the interconnect via 122 directly overlies the first interconnect wire 112, the interconnect via 122 is not arranged directly between adjacent ones of the first interconnect wires 112 in the second direction 132. In some embodiments, from the top-view 100B, the interconnect via 122 may have a circular profile. In other embodiments, from the top-view 100B, the interconnect via 122 may exhibit a rectangular, oval-like, or some other shape profile. Further, in some embodiments, additional second interconnect wires (not shown) are arranged in the second interconnect dielectric layer 120 and additional interconnect vias (not shown) couple the additional second interconnect wires to the first interconnect wires 112.

Figure 2:
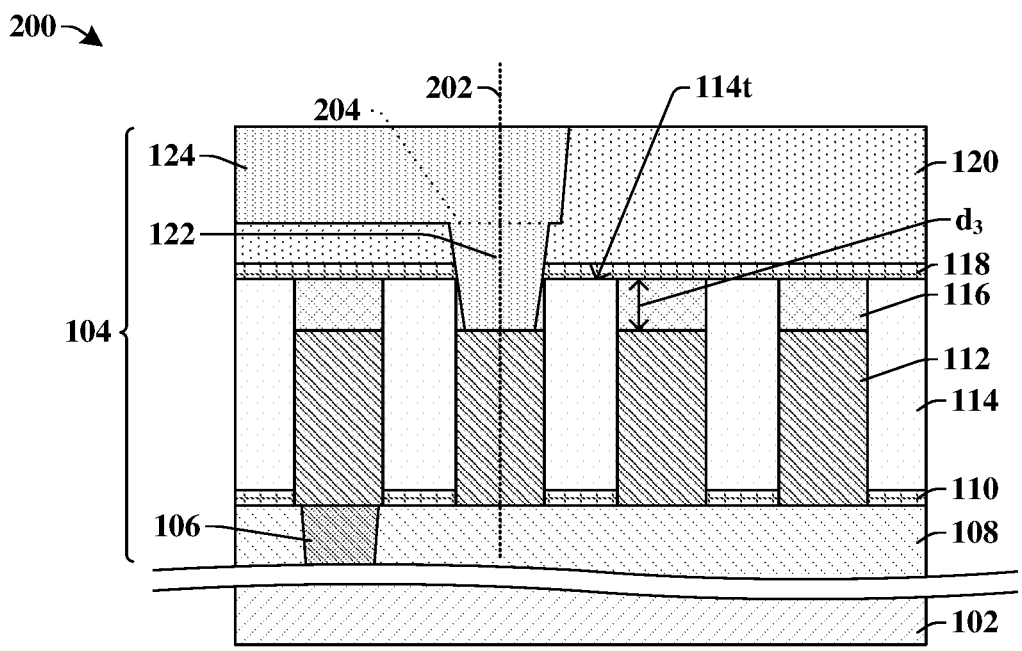
FIG. 2 illustrates a cross-sectional view some alternative embodiments of an integrated chip having a dielectric on wire structure arranged over a first interconnect wire.

FIG. 2 illustrates a cross-sectional view 200 of some embodiments of an integrated chip comprising an interconnect via extending through a dielectric on wire structure to contact a first interconnect wire, wherein the interconnect via is substantially centered over the first interconnect wire.

In some embodiments, a center of the first interconnect wire 112 that is arranged directly below the interconnect via 122 is arranged on a first line 202. In such embodiments, the first line 202 is perpendicular to a top surface of the substrate 102 and also intersects the center of the first interconnect wire 112. In some embodiments, the center of the first interconnect wire 112 is determined to be a midpoint of a width of a topmost surface of the first interconnect wire 112. In some embodiments, a center of the interconnect via 122 is similarly determined to be a midpoint of an interface 204 between the interconnect via 122 and the second interconnect wire 124. In some embodiments, as illustrated in the cross-sectional view 200 of FIG. 2, the first line 202 also intersects the center of the interconnect via 122. In such embodiments, the interconnect via 122 and the underlying first interconnect wire 112 may be classified as being "aligned" or "centered" with one another. Such embodiments, wherein the interconnect via 122 and the first interconnect wire 112 are aligned, the area of contact between the interconnect via 122 and the first interconnect wire 112 is increased. In such embodiments, an entirety of a lower surface of the interconnect via 122 directly contacts the first interconnect wire 112.

However, in some embodiments, wherein the width of the first interconnect wire 112 is so small (e.g., between about 5 nanometers and about 1000 nanometers), alignment between the interconnect via 122 and the underlying first interconnect wire 112 is rare due to processing limitations (e.g., photolithography precision, etching precision, etc.). Thus, the dielectric on wire structures 116 are still included on the first interconnect wires 112 in case of instances where the interconnect via 122 and the underlying first interconnect wire 112 are misaligned (e.g., FIGS. 1A and 3).

Further, it will be appreciated that in some other embodiments, even if the interconnect via 122 is centered over the underlying first interconnect wire 112, the interconnect via 122 may be wider than the underlying first interconnect wire 112 due to processing limitations. In such embodiments, the resulting interconnect via 122 may still have portions that directly overlie and contact the topmost surfaces 114t of the first interconnect dielectric layer 114.

Further, in some embodiments, the dielectric on wire structures 116 have a height equal to a third distance $d_3$. In some embodiments, the third distance $d_3$ is in a range of between, for example, approximately 10 angstroms and approximately 1000 angstroms. In some embodiments, the second etch stop layer 118 comprises a different material than the first interconnect dielectric layer 114. Similarly, in some embodiments, the second etch stop layer 118 comprises a different material than the dielectric on wire structures 116. In some embodiments, the second etch stop layer 118 comprises, for example, silicon carbide, silicon dioxide, silicon oxygen carbide, silicon nitride, silicon carbon nitride, silicon oxynitride, silicon oxygen carbon nitride, aluminum oxynitride, aluminum oxide, or some other suitable material. In some embodiments, the second etch stop layer 118 has a thickness in a range of between approximately 10 angstroms and approximately 1000 angstroms, for example.

In some embodiments, the lower interconnect via 106, the first interconnect wires 112, the interconnect via 122, and the second interconnect wire 124 may each comprise a conductive material, such as, for example, tantalum, tantalum nitride, titanium nitride, copper, cobalt, ruthenium, molybdenum, iridium, tungsten, or some other suitable conductive material. In some embodiments, the lower interconnect via 106, the first interconnect wires 112, the interconnect via 122, and the second interconnect wire 124 may each comprise the same material, may each comprise a different material, or may comprise a combination of similar and different materials. In some embodiments, at least the interconnect via 122 and the second interconnect wire 124 comprise a same material because they are formed by way of a dual damascene process. In some embodiments, the lower interconnect via 106, the first interconnect wires 112, the interconnect via 122, and the second interconnect wire 124 may each have a height in a range of between, for example, approximately 10 angstroms and approximately 1000 angstroms.

Figure 3:
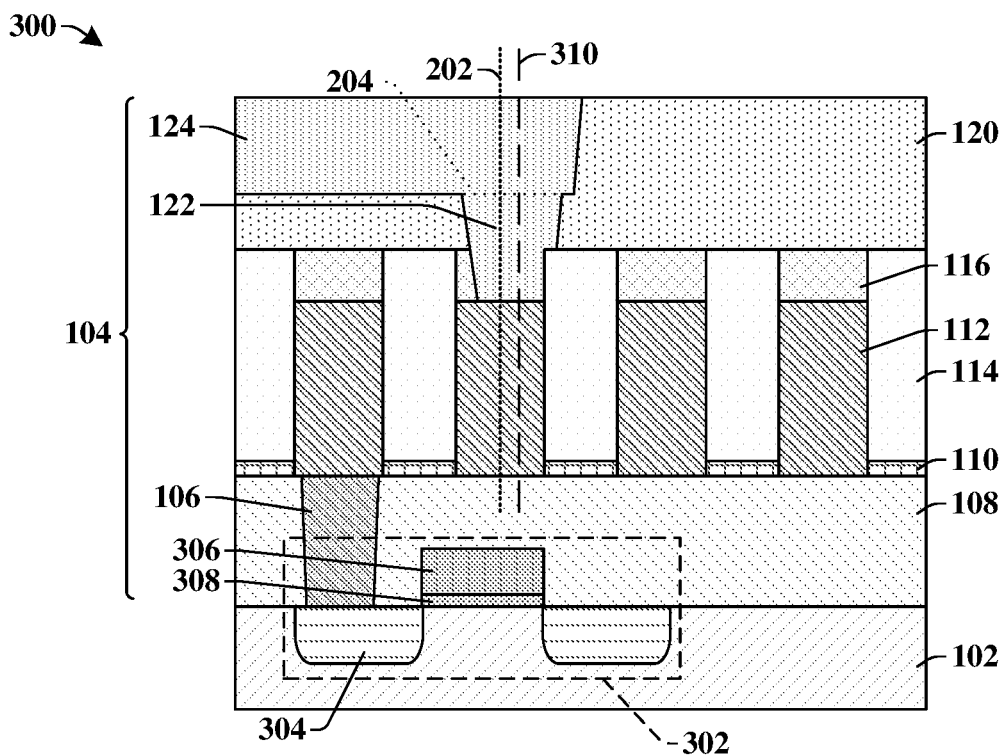
FIG. 3 illustrates a cross-sectional view of some embodiments of an integrated chip having a dielectric on wire structure arranged over a first interconnect wire, wherein the first interconnect wire is coupled to a semiconductor device.

FIG. 3 illustrates a cross-sectional view 300 of some embodiments wherein an interconnect structure comprising dielectric on wire structures is coupled to an underlying semiconductor device.

In some embodiments, the second etch stop layer (118 of FIG. 2) may be omitted. In such embodiments, the second interconnect dielectric layer 120 may comprise a different material than the first interconnect dielectric layer 114. Further, in some embodiments, the interconnect via 122 is "misaligned" or "not centered" over the underlying first interconnect wire 112. In such embodiments, a second line 310 that is perpendicular to the top surface of the substrate 102 intersects the center of the interconnect via 122, and the second line 310 is parallel to the first line 202 that intersects the center of the first interconnect wire 112. In such embodiments, when the first line 202 is parallel with and does not intersect the second line 310, the interconnect via 122 is misaligned with the underlying first interconnect wire 112. In such embodiments, as described with respect to the cross-sectional view 100A of FIG. 1A, the dielectric on wire structures 116 aid in protecting the first interconnect dielectric layer 114 during the formation of the interconnect via 122, and thus, the interconnect via 122 does not extend below upper surfaces of the first interconnect wires 112.

Further, in some embodiments, the lower interconnect via 106 is coupled to an underlying semiconductor device 302. In some embodiments, the underlying semiconductor device 302 may comprise, for example, a field effect transistor (FET). In such embodiments, the semiconductor device 302 may comprise source/drain regions 304 arranged on or within the substrate 102. The source/drain regions 304 may comprise doped portions of the substrate 102. Further, in some embodiments, the semiconductor device 302 may comprise a gate electrode 306 arranged over the substrate 102 and between the source/drain regions 304. In some embodiments, a gate dielectric layer 308 may be arranged directly between the gate electrode 306 and the substrate 102. In some embodiments, the lower interconnect via 106 is coupled to one of the source/drain regions 304, whereas in other embodiments, the lower interconnect via 106 may be coupled to the gate electrode 306 of the semiconductor device 302. Further in some embodiments, it will be appreciated that the interconnect structure 104 may couple the semiconductor device 302 to some other semiconductor device, memory device, photo device, or some other electronic device. It will be appreciated that other electronic/semiconductor devices other than the FET illustrated as the semiconductor device 302 is also within the scope of this disclosure.

FIGS. 4-17 illustrate various views 400-1700 of some embodiments of a method of forming an interconnect via over a first interconnect wire using dielectric on wire structures on the first interconnect wire to increase a processing window for formation of the interconnect via. Although FIGS. 4-17 are described in relation to a method, it will be appreciated that the structures disclosed in FIGS. 4-17 are not limited to such a method, but instead may stand alone as structures independent of the method.

Figure 4:
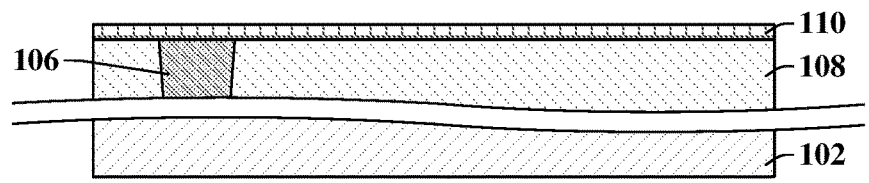
FIGS. 4-17 illustrate various views of some embodiments of a method of forming an integrated chip having a dielectric on wire structure arranged over a first interconnect wire, wherein the dielectric on wire structure aids in preventing an overlying interconnect via from being formed below a topmost surface of the first interconnect wire.

As shown in cross-sectional view 400 of FIG. 4, a substrate 102 is provided. In some embodiments, the substrate 102 may be or comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated with. In some embodiments, a lower interconnect dielectric layer 108 is formed over the substrate 102. In some embodiments, various semiconductor devices (e.g., transistors, inductors, capacitors, etc.) and/or memory devices (not shown) may be arranged over and/or within the substrate 102 and beneath the lower interconnect dielectric layer 108. In some embodiments, a lower interconnect via 106 may be formed within the lower interconnect dielectric layer 108 and coupled to the one or more of the various semiconductor devices and/or memory devices (not shown).

In some embodiments, the lower interconnect dielectric layer 108 may be formed by way of a deposition process (e.g., spin-on, physical vapor deposition (PVD), chemical vapor deposition (CVD), atomic layer deposition (ALD), etc.). In some embodiments, the lower interconnect dielectric layer 108 may have a thickness in a range of between, for example, approximately 30 angstroms and approximately 800 angstroms. In some embodiments, the lower interconnect dielectric layer 108 may comprise, for example, a low-k dielectric material such as silicon carbide, silicon dioxide, silicon oxygen carbide, silicon nitride, silicon carbon nitride, silicon oxynitride, silicon oxygen carbon nitride, or some other suitable dielectric material.

In some embodiments, the lower interconnect via 106 may be formed within the lower interconnect dielectric layer 108 through various steps of patterning (e.g., photolithography/etching), deposition (e.g., PVD, CVD, plasma-enhanced CVD (PE-CVD), ALD, sputtering, etc.), and removal (e.g., wet etching, dry etching, chemical mechanical planarization (CMP), etc.) processes. In some embodiments, the lower interconnect via 106 may comprise a conductive material such as, for example, tantalum, tantalum nitride, titanium nitride, copper, cobalt, ruthenium, molybdenum, iridium, tungsten, or some other suitable conductive material. Further, in some embodiments, the lower interconnect via 106 may have a height in a range of between, for example, approximately 10 angstroms and approximately 1000 angstroms.

In some embodiments, a first etch stop layer 110 is formed over the lower interconnect via 106 and over the lower interconnect dielectric layer 108. In some embodiments, the first etch stop layer 110 is formed by way of a deposition process (e.g., PVD, CVD, ALD, spin-on, etc.), and may be formed in a chamber set to a temperature in a range of between, for example, approximately 150 degrees Celsius and approximately 400 degrees Celsius. In some embodiments, the first etch stop layer 110 may be formed to have a thickness in a range of between, of example, approximately 10 angstroms and approximately 1000 angstroms. In some embodiments, the first etch stop layer 110 may comprise, for example, silicon carbide, silicon dioxide, silicon oxygen carbide, silicon nitride, silicon carbon nitride, silicon oxynitride, silicon oxygen carbon nitride, aluminum oxygen nitride, aluminum oxide, or some other suitable material.

Figure 5:
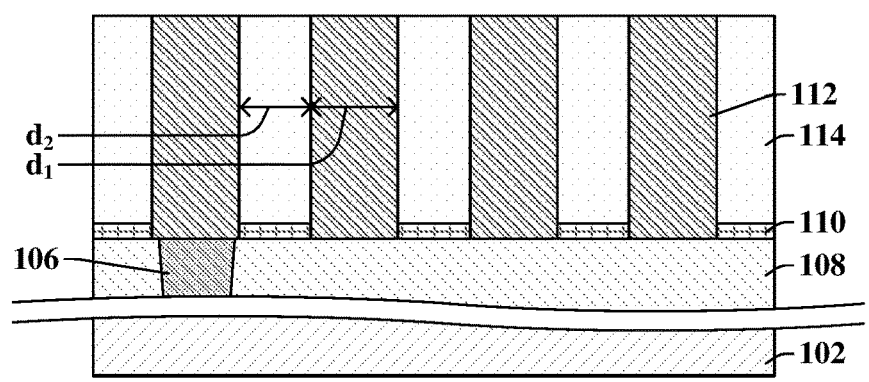

As shown in cross-sectional view 500 of FIG. 5, in some embodiments, first interconnect wires 112 embedded in a first interconnect dielectric layer 114 are formed over the first etch stop layer 110. In some embodiments, the first interconnect dielectric layer 114 may first be formed over the first etch stop layer 110, and then the first interconnect dielectric layer 114 may undergo various steps of patterning (e.g., photolithography/etching), deposition (e.g., PVD, CVD, PE-CVD, ALD, sputtering, etc.), and removal (e.g., wet etching, dry etching, CMP, etc.) processes to form the first interconnect wires 112 within the first interconnect dielectric layer 114. In other embodiments, the first interconnect wires 112 may first be formed over the first etch stop layer 110 through various steps of patterning (e.g., photolithography/etching), deposition (e.g., PVD, CVD, PE-CVD, ALD, sputtering, etc.), and removal (e.g., wet etching, dry etching, CMP, etc.) processes, and then the first interconnect dielectric layer 114 may be formed around the first interconnect wires 112.

Nevertheless, in some embodiments, the first interconnect dielectric layer 114 is formed by way of a deposition process (e.g., spin-on, PVD, CVD, ALD, etc.) in a chamber set to a temperature in a range of between approximately 400 degrees Celsius and approximately 500 degrees Celsius. In some embodiments, the first interconnect dielectric layer 114 may be formed to a thickness in a range of between, for example, approximately 30 angstroms and approximately 800 angstroms. In other embodiments, the first interconnect dielectric layer 114 may have a thickness in a range of between, for example, approximately 20 angstroms and approximately 2000 angstroms. In some embodiments, the first interconnect dielectric layer 114 may comprise a low-k dielectric material such as, for example, silicon carbide, silicon dioxide, silicon oxygen carbide, silicon nitride, silicon carbon nitride, silicon oxynitride, silicon oxygen carbon nitride, or some other suitable dielectric material.

Further, in some embodiments, the first interconnect wires 112 may be formed by way of a deposition process (e.g., spin-on, PVD, CVD, ALD, etc.) in a chamber set to a temperature in a range of between approximately 150 degrees Celsius and approximately 400 degrees Celsius. In some embodiments, just after the first interconnect wires 112 are formed, the first interconnect wires 112 may have a height equal to the height of the first interconnect dielectric layer 114. Thus, in some embodiments, just after the first interconnect wires 112 are formed, the first interconnect wires 112 have a height in a range of between approximately 20 angstroms and approximately 2000 angstroms. Further, in some embodiments, the first interconnect wires 112 each have a width equal to a first distance $d_1$ in a range of between, for example, approximately 5 nanometers and approximately 1000 nanometers. In some embodiments, the first interconnect wires 112 may be spaced apart from one another by a second distance $d_2$ in a range of between, for example, approximately 5 nanometers and approximately 1000 nanometers. In some embodiments, the first interconnect wires 112 may comprise a conductive material, such as, for example, tantalum, tantalum nitride, titanium nitride, copper, cobalt, ruthenium, molybdenum, iridium, tungsten, or some other suitable conductive material.

In some embodiments, one or more of the first interconnect wires 112 extend through the first etch stop layer 110 to directly contact one or more lower interconnect vias 106. Thus, in some embodiments, the formation of the first interconnect wires 112 also includes removing portions of the first etch stop layer 110. It will be appreciated that more or less than 4 first interconnect wires 112 may be present in the first interconnect dielectric layer 114.

Figure 6:
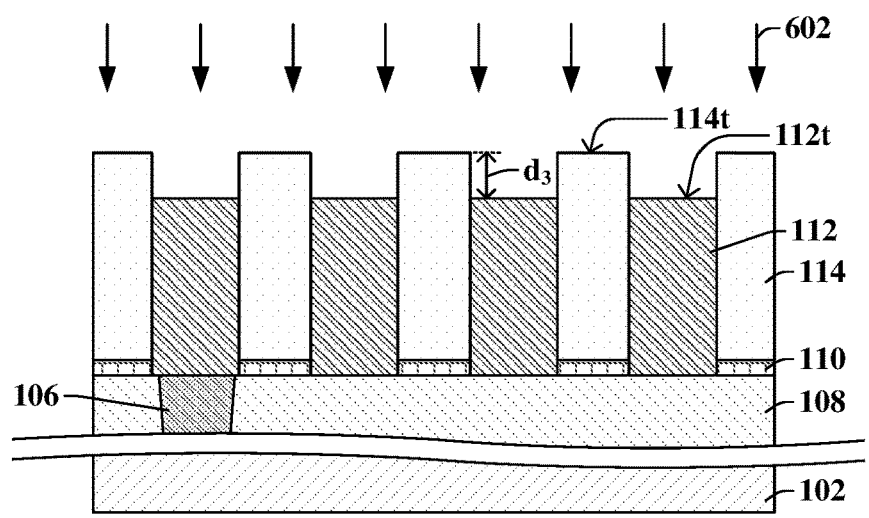

As shown in cross-sectional view 600 of FIG. 6, in some embodiments, an etch-back removal process 602 may be performed to remove upper portions of the first interconnect wires 112. In some embodiments, the etch-back removal process 602 is achieved by, for example, inductively coupled plasma, capacitively coupled plasma, remote plasma, isotropic chemical etching, wet etching, or some other suitable dry or wet etching process. In some embodiments, the first interconnect dielectric layer 114 is substantially resistant to removal by the etch-back removal process 602. Thus, in some embodiments, masking structures to protect the first interconnect dielectric layer 114 from the etch-back removal process 602 are not needed, thereby increasing manufacturing efficiency.

In some embodiments, after the etch-back removal process 602, topmost surfaces 112t of the first interconnect wires 112 are arranged below topmost surfaces 114t of the first interconnect dielectric layer 114 by a third distance $d_3$. In some embodiments, the third distance $d_3$ may be in a range of between, for example, approximately 10 angstroms and approximately 1000 angstroms. Thus, in some embodiments, after the etch-back removal process 602, the first interconnect wires 112 have a height in a range of between approximately 10 angstroms and approximately 1000 angstroms.

Figure 7:
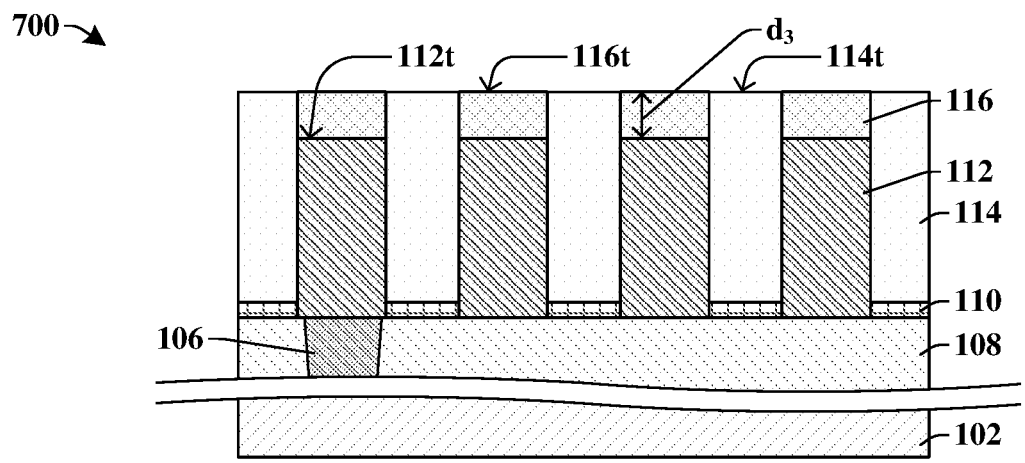

As shown in cross-sectional view 700 of FIG. 7, in some embodiments, dielectric on wire structures 116 are formed over the first interconnect wires 112. In some embodiments, the dielectric on wire structures 116 comprise for example, hafnium oxide, lithium niobium oxide, lithium nitrogen oxide, magnesium oxide, manganese oxide, molybdenum oxide, niobium oxide, nitrogen oxide, silicon oxide, silicon oxygen carbide, silicon oxygen carbon nitride, silicon oxynitride, silicon carbide, tin oxide, tin silicon oxide, strontium oxide, tantalum oxide, tantalum oxynitride, titanium oxide, titanium oxynitride, tungsten oxide, zinc oxide, zirconium oxide, or some other suitable dielectric material or metal-oxide. The dielectric on wire structures 116 comprise a different material than the first interconnect dielectric layer 114. In some embodiments, the dielectric on wire structures 116 may be formed by way of a deposition process (e.g., PVD, CVD, ALD, spin-on, etc.) in a chamber set to a temperature in a range of between, for example, approximately 150 degrees Celsius and approximately 400 degrees Celsius. In some embodiments, the dielectric on wire structures 116 comprise a material that can be selectively deposited on the topmost surfaces 112t of the first interconnect wires 112 and not on the first interconnect dielectric layer 114. In some embodiments, a removal process, such as, for example, a planarization process (e.g., CMP), is performed to remove any excess material of the dielectric on wire structures 116 arranged over the topmost surfaces 114t of the first interconnect dielectric layer 114. Thus, in some embodiments, the dielectric on wire structures 116 have topmost surfaces 116t that are substantially coplanar to the topmost surfaces 114t of the first interconnect dielectric layer 114. In some embodiments, such a removal and/or planarization process is omitted. In some embodiments, the dielectric on wire structures 116 have a height equal to the third distance $d_3$.

Figure 8:
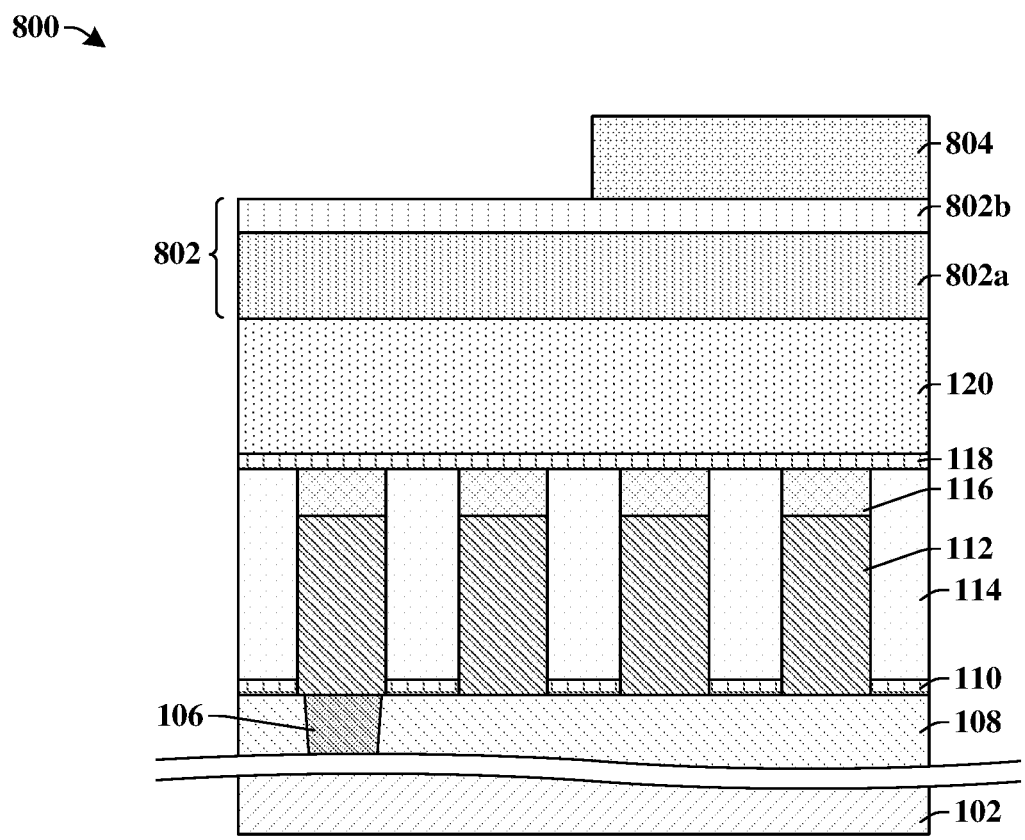

As shown in cross-sectional view 800 of FIG. 8, in some embodiments, a second interconnect dielectric layer 120 is formed over the first interconnect dielectric layer 114 and the dielectric on wire structures 116. In some embodiments, the second interconnect dielectric layer 120 is formed by way of a deposition process (e.g., PVD, CVD, ALD, sputtering, etc.). In some embodiments, the second interconnect dielectric layer 120 comprises a dielectric material such as, for example, silicon carbide, silicon dioxide, silicon oxygen carbide, silicon nitride, silicon carbon nitride, silicon oxynitride, silicon oxygen carbon nitride, or some other suitable dielectric material. In some embodiments, the second interconnect dielectric layer 120 comprises a different material than the first interconnect dielectric layer 114. In other embodiments, the second interconnect dielectric layer 120 comprises a same material as the first interconnect dielectric layer 114. In such other embodiments, a second etch stop layer 118 may be formed over the first interconnect dielectric layer 114 prior to the formation of the second interconnect dielectric layer 120. In some embodiments, the second etch stop layer 118 may be formed under the same or similar conditions as the first etch stop layer 110 and/or may comprise the same or similar materials as the first etch stop layer 110. In some embodiments, if the first and second interconnect dielectric layers 114, 120 comprise different materials, the second etch stop layer 118 may or may not be formed between the first and second interconnect dielectric layers 114, 120.

In some embodiments, a first anti-reflective structure 802 may be formed over the second interconnect dielectric layer 120. In some embodiments, the first anti-reflective structure 802 may comprise, for example, a first anti-reflective layer 802a and a second anti-reflective layer 802b. In some embodiments, the first anti-reflective structure 802 aids in future patterning/photolithography processes. In some embodiments, the first anti-reflective structure 802 is formed by way of a deposition process (e.g., spin-on, CVD, PVD, ALD, etc.) and comprises an organic or an inorganic material. In some embodiments, a first masking structure 804 is formed over the first anti-reflective structure 802 by using photolithography and removal (e.g., etching) processes. In some embodiments, the first masking structure 804 comprises a photoresist or hard mask material. In some embodiments, the first masking structure 804 directly covers one or more of the first interconnect wires 112, whereas one or more of the first interconnect wires 112 do not directly underlie the first masking structure 804.

Figure 9:
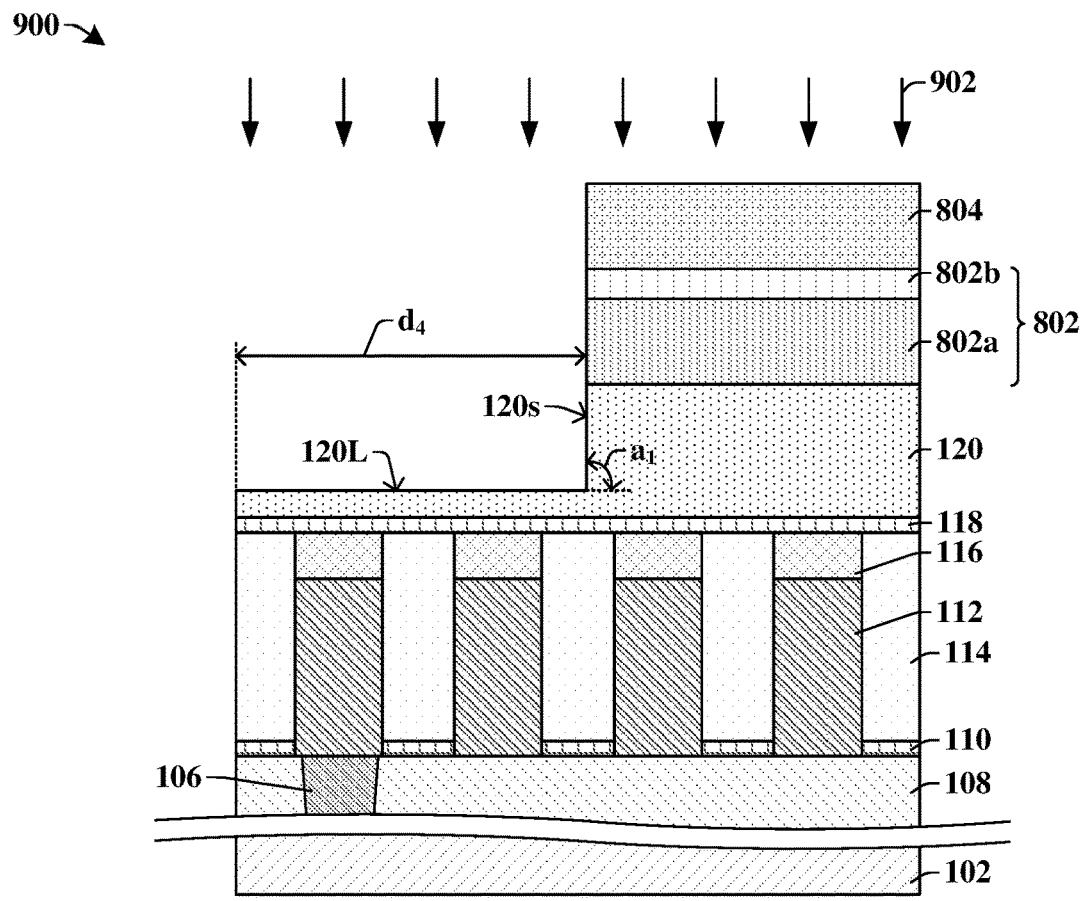

As shown in cross-sectional view 900 of FIG. 9, a first removal process 902 is performed to according to the first masking structure 804 to remove portions of the second interconnect dielectric layer 120. In some embodiments, portions of the first anti-reflective structure 802 that do not directly underlie the first masking structure 804 are completely removed during the first removal process 902, and upper portions of the second interconnect dielectric layer 120 that do not directly underlie the first masking structure 804 are removed during the first removal process 902. In some embodiments, after the first removal process 902, the second interconnect dielectric layer 120 still fully covers the second etch stop layer 118. In some embodiments, the portion of the second interconnect dielectric layer 120 uncovered by the first masking structure 804 has a width about equal to a fourth distance $d_4$. In some embodiments, the fourth distance $d_4$ is in a range of between, for example, approximately 5 nanometers and approximately 3000 nanometers. In some embodiments, a new sidewall 120s of the second interconnect dielectric layer 120 defined by the first removal process 902 may be situated at a first angle $a_1$ with respect to a new lower surface 120L. In some embodiments, the first angle $a_1$ is measured away from to the new lower surface 120L as illustrated in FIG. 9, and may be in a range of between approximately 50 degrees and approximately 95 degrees.

In some embodiments, the first removal process 902 may be or comprise an etching process. For example, in some embodiments, the first removal process 902 may be or comprise reactive-ion etching, inductively coupled plasma, and/or capacitively coupled plasma. In such embodiments, the first removal process 902 may utilize one or more of the following gas etchants: a carbon-hydrogen gas (e.g., $CH_4$), a fluoride-based gas (e.g., $CH_3F$, $CH_2F_2$, $C_4F_8$, $C_4F_6$, $CF_4$), hydrogen bromide, a carbon monoxide, carbon dioxide, boron trichloride, chlorine, nitrogen, helium, neon, argon, or some other suitable gas. In some embodiments, the first removal process 902 may be conducted in a chamber set to a temperature in a range of between approximately 0 degrees Celsius and approximately 100 degrees Celsius; to a pressure in a range of between approximately 0.2 millitorr and approximately 120 millitorr; to a power in a range of between approximately 50 watts and approximately 3000 watts; and to a bias in a range of between approximately 0 volts and approximately 1200 volts.

Figure 10:
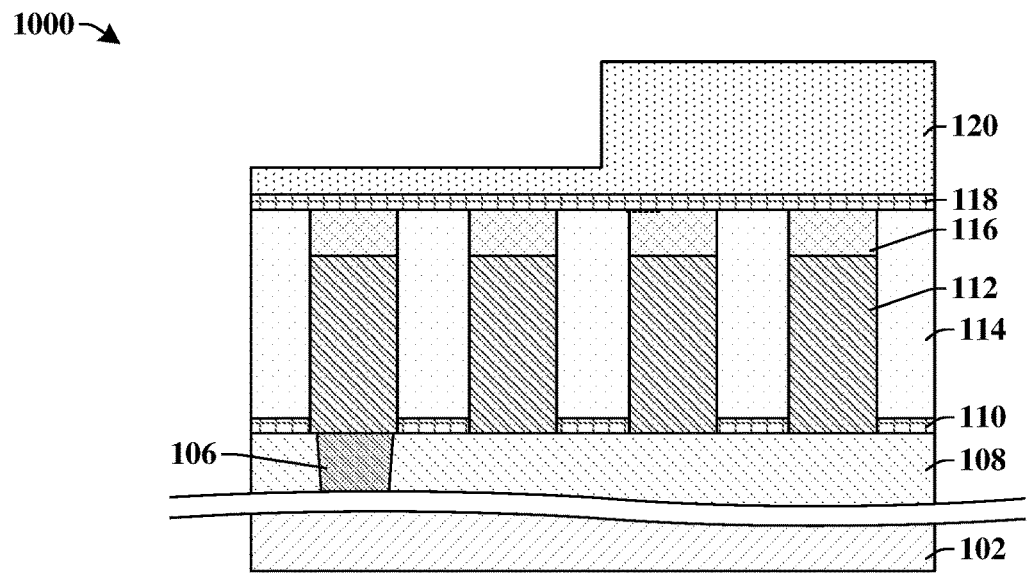

As shown in cross-sectional view 1000 of FIG. 10, in some embodiments, the first anti-reflective structure (802 of FIG. 9) and the first masking structure (804 of FIG. 9) are completely removed from the second interconnect dielectric layer 120. In some embodiments, the first anti-reflective structure (802 of FIG. 9) and the first masking structure (804 of FIG. 9) are removed by way of a wet etchant, and the second interconnect dielectric layer 120 may remain substantially unaffected by the wet etchant.

Figure 11:
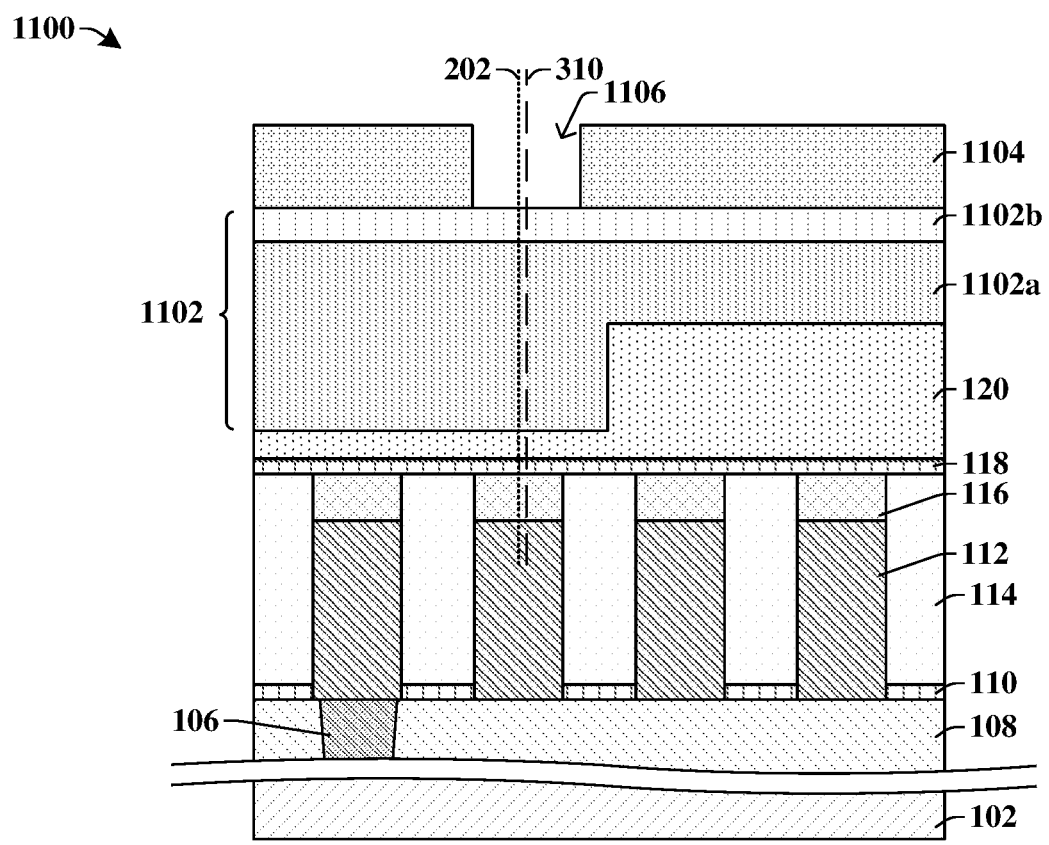

As shown in cross-sectional view 1100 of FIG. 11, a second masking structure 1104 is formed over the second interconnect dielectric layer 120. In some embodiments, the second masking structure 1104 comprises a first opening 1106 arranged directly over one of the first interconnect wires 112. In some embodiments, prior to the formation of the second masking structure 1104, a second anti-reflective structure 1102 may be formed over the second interconnect dielectric layer 120. In some embodiments, the second anti-reflective structure 1102 may comprise a fourth anti-reflective layer 1102b arranged over a third anti-reflective layer 1102a. In some embodiments, the second anti-reflective structure 1102 aids in future patterning/photolithography processes. In some embodiments, the second anti-reflective structure 1102 and the second masking structure 1104 may be formed using similar processes as the formation of the first anti-reflective structure (802 of FIG. 8) and the first masking structure (804 of FIG. 8), respectively. Similarly, in some embodiments, the second anti-reflective structure 1102 and the second masking structure 1104 comprise similar materials as the first anti-reflective structure (802 of FIG. 8) and the first masking structure (804 of FIG. 8), respectively.

In some embodiments, a first line 202 intersects a center of the first interconnect wire 112 that directly underlies the first opening 1106 of the second masking structure 1104. In some embodiments, a second line 310 intersects a center of the first opening 1106. In some embodiments, the center of the first interconnect wire 112 may be defined as a midpoint of a width of the first interconnect wire 112, and similarly, the center of the first opening 1106 may be defined as a midpoint of a width of the first opening 1106. In some embodiments, the first line 202 and the second line 310 are perpendicular to a topmost surface of the substrate 102. In some embodiments, due to photolithography precision and/or accuracy limitations, for example, the first line 202 may be offset from the second line 310. In such embodiments, the first opening 1106 may directly overlie a portion of the first interconnect dielectric layer 114. In such embodiments, the first opening 1106 of the second masking structure 1104 may be determined to be "misaligned" with the underlying one of the first interconnect wires 112.

In some other embodiments, the first line 202 may be collinear with the second line 310, and the first opening 1106 may directly overlie only the underlying one of the first interconnect wires 112. In such other embodiments, the first opening 1106 may be determined to be aligned with the underlying one of the first interconnect wires 112. In yet other embodiments, the first line 202 may be collinear with the second line 310, but a width of the first opening 1106 may be greater than a width of the first interconnect wire 112. In such other embodiments, the first opening 1106 may still directly overlie portions of the first interconnect dielectric layer 114. In some embodiments, a width of the first opening 1106 may be in a range of between, for example, approximately 5 nanometers and approximately 300 nanometers.

Figure 12A:
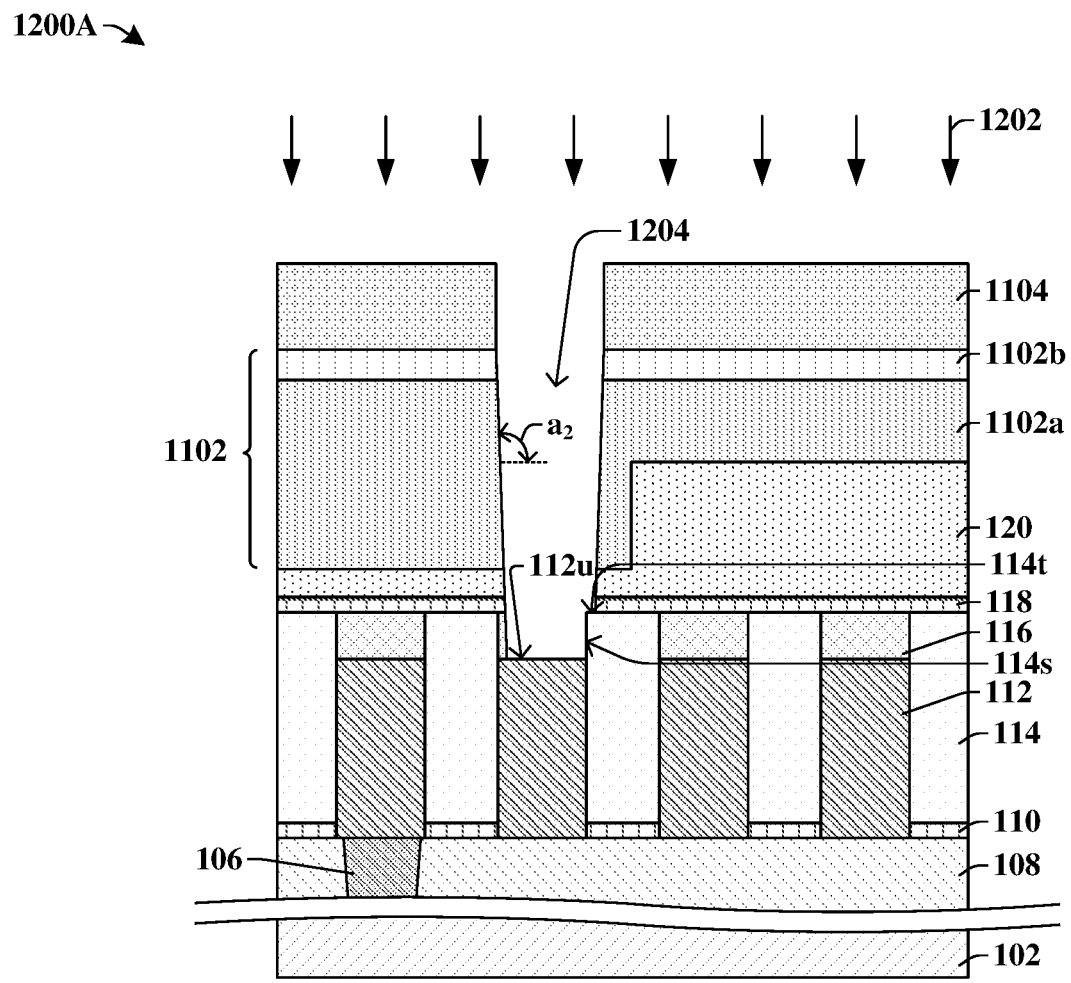
Figure 12B:
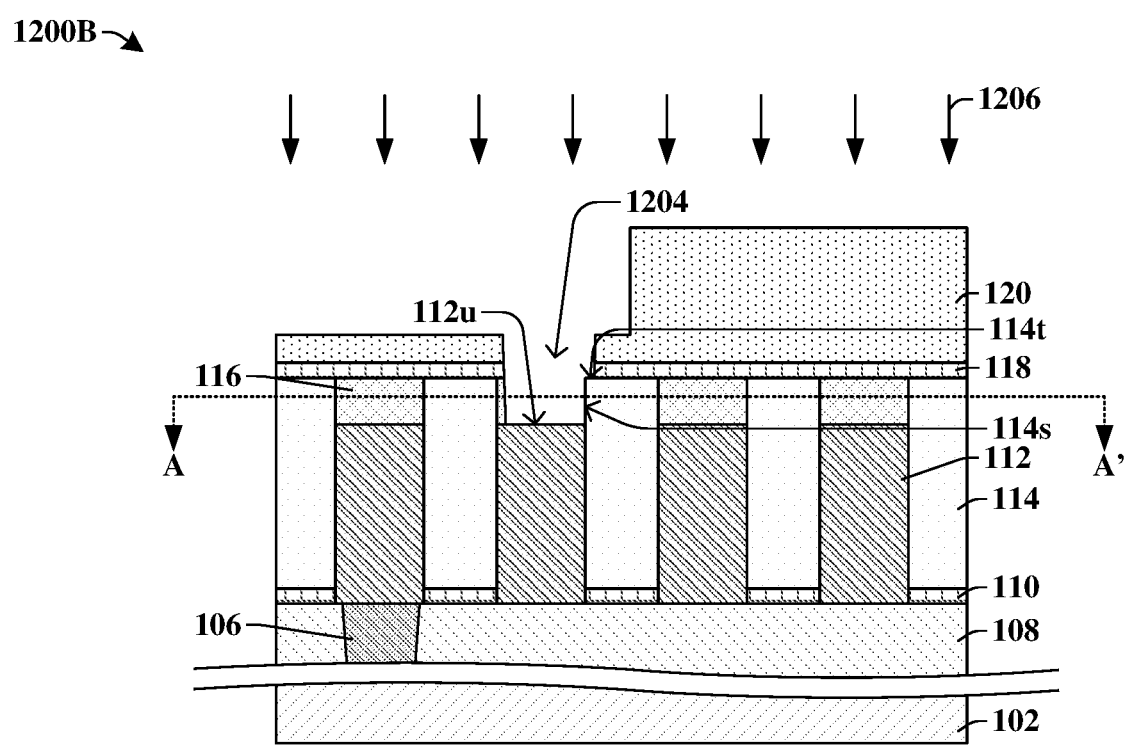

FIGS. 12A and 12B illustrate cross-sectional views 1200A and 1200B, respectively, of some embodiments of performing photolithography and removal processes to expose an upper surface of one of the first interconnect wires.

As shown in cross-sectional view 1200A of FIG. 12A, in some embodiments, a first via removal process 1202 is performed to remove portions of the second anti-reflective structure 1102, the second interconnect dielectric layer 120, the second etch stop layer 118, and the dielectric on wire structure 116 that directly underlie the first opening (1106 of FIG. 11) of the second masking structure 1104. In such embodiments, the first via removal process 1202 forms a cavity 1204 through the second anti-reflective structure 1102, the second interconnect dielectric layer 120, the second etch stop layer 118, and the dielectric on wire structure 116 to expose an upper surface 112u of the first interconnect wire 112 that directly underlies the first opening (1106 of FIG. 11) of the second masking structure 1104. In some embodiments, the cavity 1204 may have sidewalls angled at a second angle $a_2$. In some embodiments, the second angle $a_2$ may be in a range of between, for example, approximately 90 degrees and approximately 140 degrees.

In some embodiments, the first via removal process 1202 comprises one or more dry etchants used to remove the portions of the second anti-reflective structure 1102, the second interconnect dielectric layer 120, the second etch stop layer 118, and the dielectric on wire structure 116. In some embodiments, the first via removal process 1202 may be achieved using the same or similar parameters (e.g., etchant gases, chamber conditions) as the first removal process (902 of FIG. 9). Thus, in some embodiments, the first via removal process 1202 may be or comprise reactive-ion etching, inductively coupled plasma, remote plasma, and/or capacitively coupled plasma. In such embodiments, the first via removal process 1202 may utilize one or more of the following gas etchants: a carbon-hydrogen gas (e.g., $CH_4$), a fluoride-based gas (e.g., $CH_3F$, $CH_2F_2$, $C_4F_8$, $C_4F_6$, $CF_4$), hydrogen bromide, a carbon monoxide, carbon dioxide, boron trichloride, chlorine, nitrogen, helium, neon, argon, or some other suitable gas. In some embodiments, the first via removal process 1202 may be conducted in a chamber set to a temperature in a range of between approximately 0 degrees Celsius and approximately 100 degrees Celsius; to a pressure in a range of between approximately 0.2 millitorr and approximately 120 millitorr; to a power in a range of between approximately 50 watts and approximately 3000 watts; and to a bias in a range of between approximately 0 volts and approximately 1200 volts.

In some embodiments, the cavity 1204 may also expose a topmost surface 114t of the first interconnect dielectric layer 114. Further, in some embodiments, the cavity 1204 may expose a sidewall 114s of the first interconnect dielectric layer 114. However, in such embodiments, the first interconnect dielectric layer 114 may be substantially resist to removal by the one or more dry etchants of the first via removal process 1202. More specifically, in some embodiments, the first interconnect dielectric layer 114 may be resistant to removal by the dry etchant(s) used to remove the second etch stop layer 118 and the dielectric on wire structures 116. In some embodiments, the first interconnect dielectric layer 114 is also resistant to removal by the dry etchant(s) used to remove the second interconnect dielectric layer 120. Thus, the first interconnect dielectric layer 114 comprises a different material than the dielectric on wire structures 116 such that the first interconnect dielectric layer 114 and the dielectric on wire structure 116 have different etch selectivities during the first via removal process 1202. In some embodiments, a difference in the etch selectivity between the first interconnect dielectric layer 114 and the dielectric on wire structure 116 is in a range of about 15 and about 25, for example. This way, the first interconnect dielectric layer 114 may be protected during the first via removal process 1202, thereby maintaining isolation between the first interconnect wires 112 provided by the first interconnect dielectric layer 114.

As shown in cross-sectional view 1200B of FIG. 12B, in some embodiments, a first mask removal process 1206 is performed to remove the second anti-reflective structure (1102 of FIG. 12A) and the second masking structure (1104 of FIG. 12A). In some embodiments, the first mask removal process 1206 comprises a wet clean etchant. In such embodiments, the second interconnect dielectric layer 120, the first interconnect dielectric layer 114, the second etch stop layer 118, the dielectric on wire structure 116, and the first interconnect wire 112 may be substantially unaffected by the first mask removal process 1206.

Figure 13A:
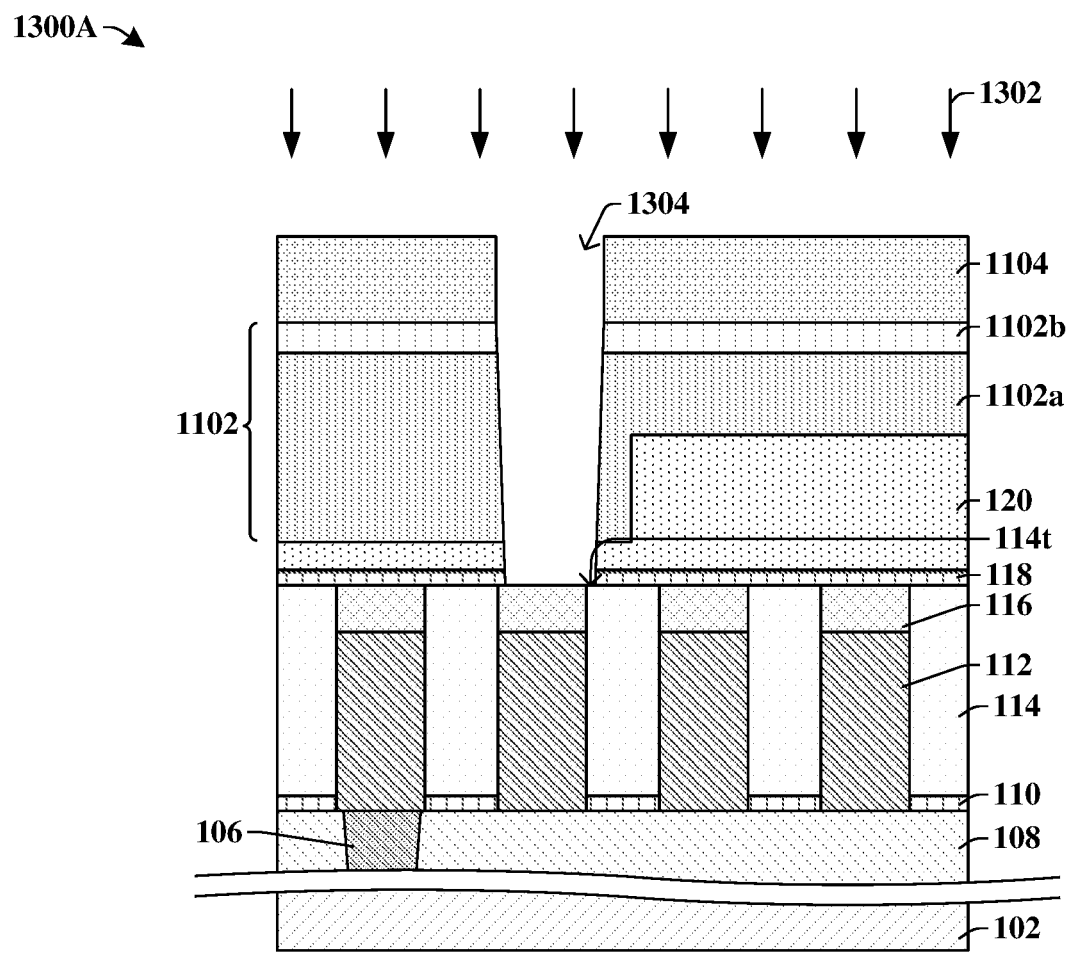
Figure 13B:
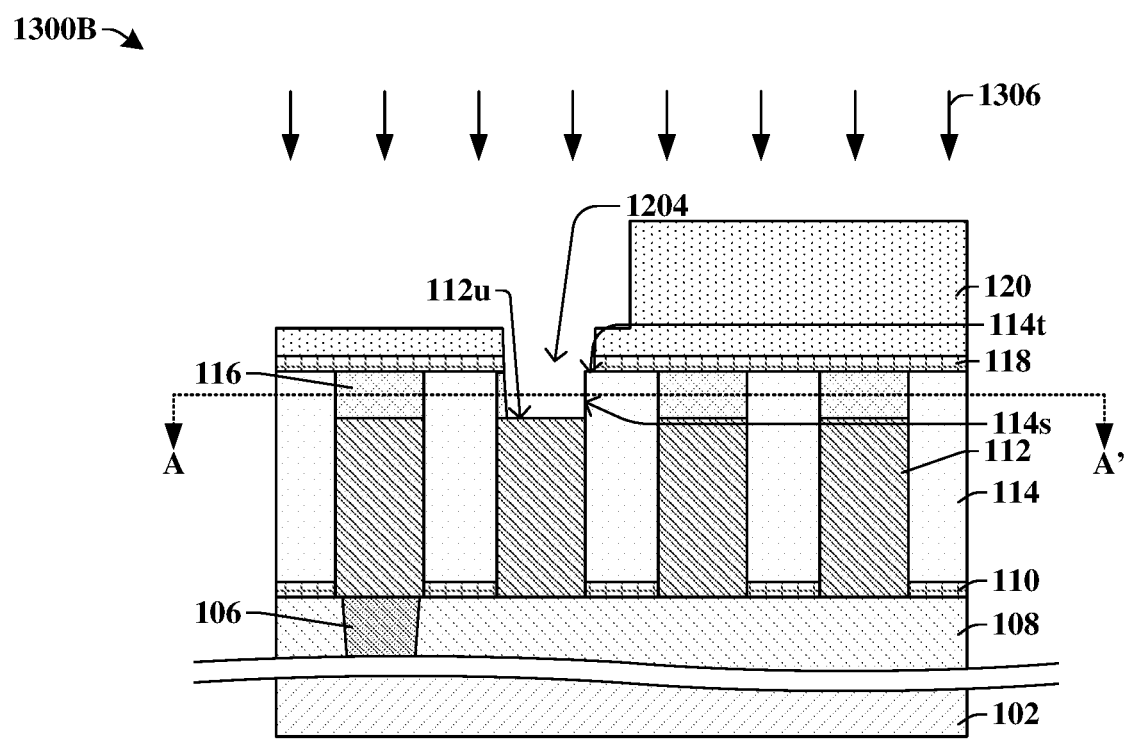

FIGS. 13A and 13B illustrate cross-sectional views 1300A and 1300B, respectively, of some other embodiments of performing photolithography and removal processes to expose the upper surface 112u of one of the first interconnect wires 112. Thus, in some embodiments, the method may proceed from the cross-sectional view 1100 of FIG. 11 to the cross-sectional view 1300A of FIG. 13A, thereby skipping the acts illustrated in cross-sectional views 1200A and 1200B of FIGS. 12A and 12B, respectively.

As shown in cross-sectional view 1300A of FIG. 13A, in some embodiments, a second via removal process 1302 is performed to remove portions of the second anti-reflective structure 1102, the second interconnect dielectric layer 120, and the second etch stop layer 118 that directly underlie the first opening (1106 of FIG. 11) of the second masking structure 1104. In such embodiments, the second via removal process 1302 may form a first sub-cavity 1304 through the second anti-reflective structure 1102, the second interconnect dielectric layer 120, and the second etch stop layer 118 to expose the dielectric on wire structure 116 arranged directly below the first opening (1106 of FIG. 11) of the second masking structure 1104. Thus, in some embodiments, the dielectric on wire structure 116 is not removed by the second via removal process 1302. In some embodiments, the first sub-cavity 1304 also exposes a topmost surface 114t of the first interconnect dielectric layer 114. In such embodiments, the first interconnect dielectric layer 114 is substantially resistant to removal by the second via removal process 1302.

In some embodiments, the second via removal process 1302 comprises one or more dry etchants used to remove the portions of the second anti-reflective structure 1102, the second interconnect dielectric layer 120, and the second etch stop layer 118. In some embodiments, the second via removal process 1302 may be achieved using the same or similar parameters (e.g., etchant gases, chamber conditions) as the first removal process (902 of FIG. 9). Thus, in some embodiments, the second via removal process 1302 may be or comprise reactive-ion etching, inductively coupled plasma, remote plasma, and/or capacitively coupled plasma. In such embodiments, the second via removal process 1302 may utilize one or more of the following gas etchants: a carbon-hydrogen gas (e.g., $CH_4$), a fluoride-based gas (e.g., $CH_3F$, $CH_2F_2$, $C_4F_8$, $C_4F_6$, $CF_4$), hydrogen bromide, a carbon monoxide, carbon dioxide, boron trichloride, chlorine, nitrogen, helium, neon, argon, or some other suitable gas. In some embodiments, the second via removal process 1302 may be conducted in a chamber set to a temperature in a range of between approximately 0 degrees Celsius and approximately 100 degrees Celsius; to a pressure in a range of between approximately 0.2 millitorr and approximately 120 millitorr; to a power in a range of between approximately 50 watts and approximately 3000 watts; and to a bias in a range of between approximately 0 volts and approximately 1200 volts.

As shown in cross-sectional view 1300B of FIG. 13B, in some embodiments, a second mask removal process 1306 is performed to remove the second anti-reflective structure (1102 of FIG. 13A) and the second masking structure (1104 of FIG. 13A). In some embodiments, the second mask removal process 1306 comprises a wet clean etchant. In some embodiments, the second mask removal process 1306 also removes portions of the dielectric on wire structure 116 arranged directly below the first sub-cavity (1304 of FIG. 13A) thereby forming a cavity 1204 that extends through the second interconnect dielectric layer 120, the second etch stop layer 118, and the dielectric on wire structure 116 to expose an upper surface 112u of the first interconnect wire 112. In other embodiments, a different wet etchant or a dry etchant is used to remove portions of the dielectric on wire structure 116 after the removal of the second masking structure (1104 of FIG. 13A).

In some embodiments, the topmost surface 114t of the first interconnect dielectric layer 114 and a sidewall 114s of the first interconnect dielectric layer 114 are exposed during the second mask removal process 1306. However, in such embodiments, the first interconnect dielectric layer 114 may be substantially resistant to removal by the second mask removal process 1306. Thus, the first interconnect dielectric layer 114 comprises a different material than the dielectric on wire structures 116 such that the first interconnect dielectric layer 114 and the dielectric on wire structure 116 have different etch selectivities during the second mask removal process 1306. This way, the first interconnect dielectric layer 114 may be protected during the second mask removal process 1306, thereby maintaining isolation between the first interconnect wires 112 provided by the first interconnect dielectric layer 114.

Figure 14A:
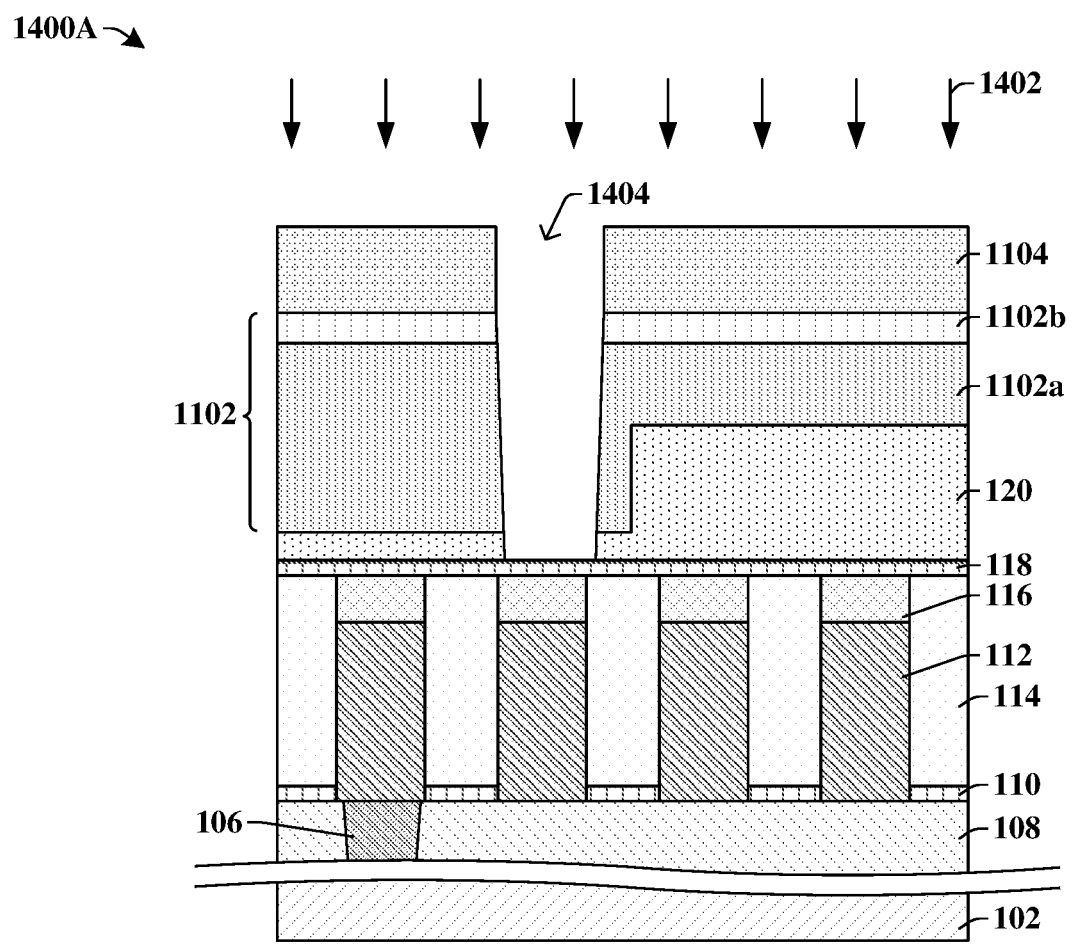
Figure 14B:
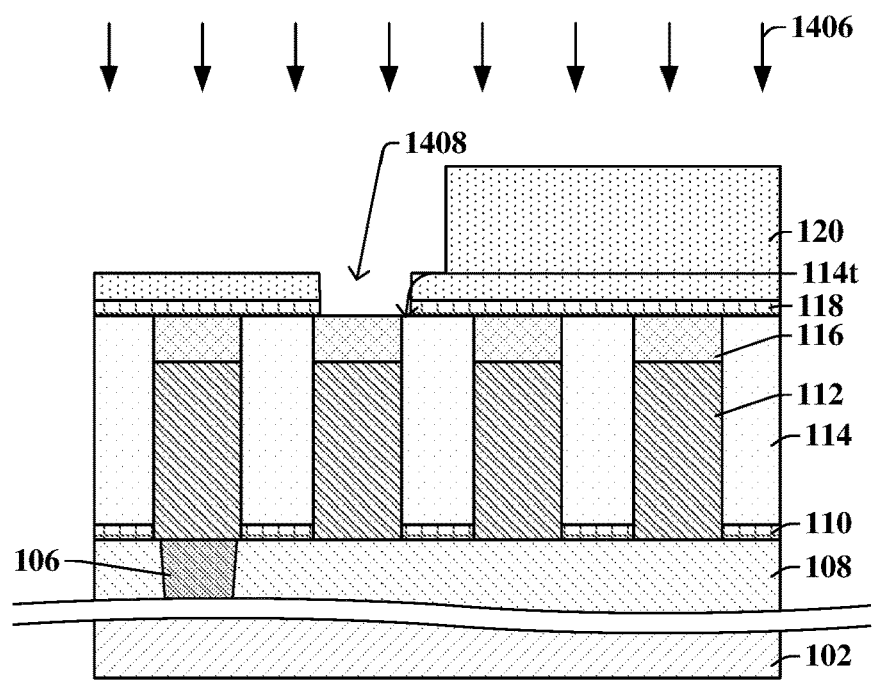
Figure 14C:
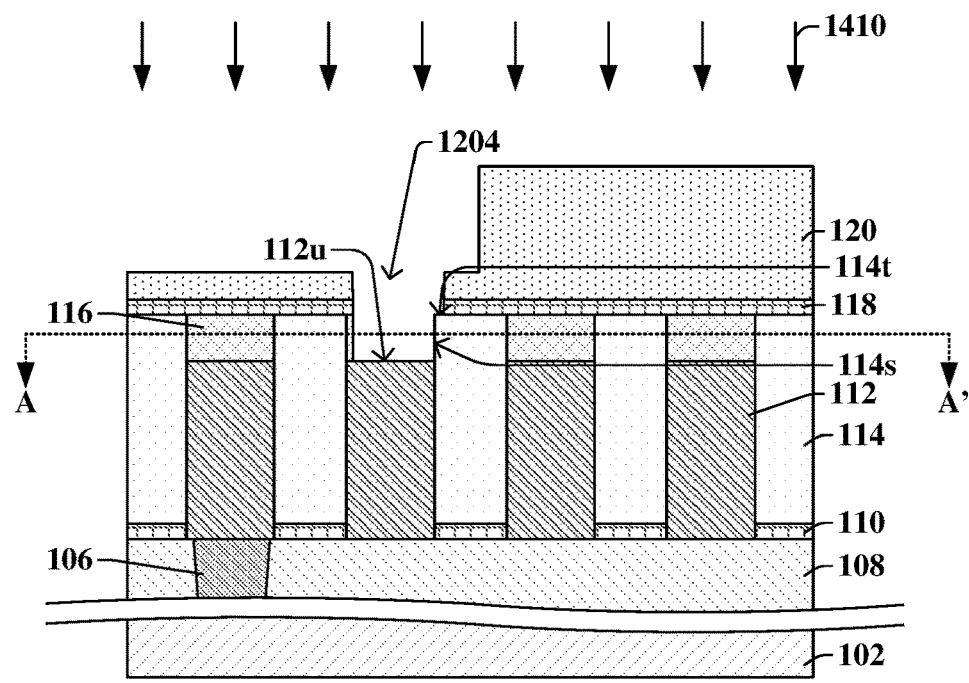

FIGS. 14A, 14B, and 14C illustrate cross-sectional views 1400A, 1400B and 1400C, respectively, of yet some other embodiments of performing photolithography and removal processes to expose an upper surface 112u of one of the first interconnect wires. Thus, in some embodiments, the method may proceed from the cross-sectional view 1100 of FIG. 11 to the cross-sectional view 1400A of FIG. 14A, thereby skipping the acts illustrated in cross-sectional views 1200A, 1200B, 1300A, and 1300B of FIGS. 12A, 12B, 13A, and 13B, respectively.

As shown in cross-sectional view 1400A of FIG. 14A, in some embodiments, a third via removal process 1402 is performed to remove portions of the second anti-reflective structure 1102 and the second interconnect dielectric layer 120 that directly underlie the first opening (1106 of FIG. 11) of the second masking structure 1104. In such embodiments, the third via removal process 1402 may form a second sub-cavity 1404 through the second anti-reflective structure 1102 and the second interconnect dielectric layer 120 to expose the second etch stop layer 118 arranged directly below the first opening (1106 of FIG. 11) of the second masking structure 1104. Thus, in some embodiments, the second etch stop layer 118 is not removed by the third via removal process 1402.

In some embodiments, the third via removal process 1402 comprises one or more dry etchants used to remove the portions of the second anti-reflective structure 1102 and the second interconnect dielectric layer 120. In some embodiments, the third via removal process 1402 may be achieved using the same or similar parameters (e.g., etchant gases, chamber conditions) as the first removal process (902 of FIG. 9). Thus, in some embodiments, the third via removal process 1402 may be or comprise reactive-ion etching, inductively coupled plasma, remote plasma, and/or capacitively coupled plasma. In such embodiments, the third via removal process 1402 may utilize one or more of the following gas etchants: a carbon-hydrogen gas (e.g., $CH_4$), a fluoride-based gas (e.g., $CH_3F$, $CH_2F_2$, $C_4F_8$, $C_4F_6$, $CF_4$), hydrogen bromide, a carbon monoxide, carbon dioxide, boron trichloride, chlorine, nitrogen, helium, neon, argon, or some other suitable gas. In some embodiments, the third via removal process 1402 may be conducted in a chamber set to a temperature in a range of between approximately 0 degrees Celsius and approximately 100 degrees Celsius; to a pressure in a range of between approximately 0.2 millitorr and approximately 120 millitorr; to a power in a range of between approximately 50 watts and approximately 3000 watts; and to a bias in a range of between approximately 0 volts and approximately 1200 volts.

As shown in cross-sectional view 1400B of FIG. 14B, in some embodiments, a third mask removal process 1406 is performed to remove the second anti-reflective structure (1102 of FIG. 14A) and the second masking structure (1104 of FIG. 14A). In some embodiments, the third mask removal process 1406 comprises a first wet clean etchant to remove the second anti-reflective structure (1102 of FIG. 14A) and the second masking structure (1104 of FIG. 14A). In some embodiments, the third mask removal process 1406 also removes a portion of the second etch stop layer 118 arranged below the second sub-cavity (1404 of FIG. 14A) using the first wet clean etchant. In some other embodiments, a second etchant (e.g., wet etchant or dry etchant) is used after the first wet clean etchant to selectively remove the second etch stop layer 118 arranged below the second sub-cavity (1404 of FIG. 14A), according to the second interconnect dielectric layer 120.

In some embodiments, the third mask removal process 1406 forms a third sub-cavity 1408 that exposes the dielectric on wire structure 116. In some embodiments, the third sub-cavity 1408 formed by the third mask removal process 1406 also exposes a topmost surface 114t of the first interconnect dielectric layer 114. In such embodiments, the first interconnect dielectric layer 114 and the dielectric on wire structure 116 may be substantially resistant to removal by the third mask removal process 1406.

As shown in cross-sectional view 1400C of FIG. 14C, in some embodiments, a fourth via removal process 1410 is performed to remove portions of the dielectric on wire structure 116 arranged below the third sub-cavity (1408 of FIG. 14B). In such embodiments, the second interconnect dielectric layer 120 may act as a masking structure during the fourth via removal process 1410. In such embodiments, the second interconnect dielectric layer 120 may be substantially resistant to removal by the fourth via removal process 1410.

In some embodiments, the fourth via removal process 1410 comprises a wet etchant or one or more dry etchants used to remove the portions of the dielectric on wire structure 116. In some embodiments, the fourth via removal process 1410 may be achieved using the same or similar parameters (e.g., etchant gases, chamber conditions) as the first removal process (902 of FIG. 9). Thus, in some embodiments, the fourth via removal process 1410 may be or comprise reactive-ion etching, inductively coupled plasma, remote plasma, and/or capacitively coupled plasma. In such embodiments, the fourth via removal process 1410 may utilize one or more of the following gas etchants: a carbon-hydrogen gas (e.g., $CH_4$), a fluoride-based gas (e.g., $CH_3F$, $CH_2F_2$, $C_4F_8$, $C_4F_6$, $CF_4$), hydrogen bromide, a carbon monoxide, carbon dioxide, boron trichloride, chlorine, nitrogen, helium, neon, argon, or some other suitable gas. In some embodiments, the fourth via removal process 1410 may be conducted in a chamber set to a temperature in a range of between approximately 0 degrees Celsius and approximately 100 degrees Celsius; to a pressure in a range of between approximately 0.2 millitorr and approximately 120 millitorr; to a power in a range of between approximately 50 watts and approximately 3000 watts; and to a bias in a range of between approximately 0 volts and approximately 1200 volts.

In such some embodiments, the topmost surface 114t and a sidewall 114s of the first interconnect dielectric layer 114 are exposed during the fourth via removal process 1410 and are substantially resistant to removal by the fourth via removal process 1410. In some embodiments, the fourth via removal process 1410 forms a cavity 1204 that extends through the second interconnect dielectric layer 120, the second etch stop layer 118, and the dielectric on wire structure 116 to expose an upper surface 112u of one of the first interconnect wires 112. Thus, the first interconnect dielectric layer 114 comprises a different material than the dielectric on wire structures 116 such that the first interconnect dielectric layer 114 and the dielectric on wire structure 116 have different etch selectivities during the fourth via removal process 1410. This way, the first interconnect dielectric layer 114 may be protected during the fourth via removal process 1410, thereby maintaining isolation between the first interconnect wires 112 provided by the first interconnect dielectric layer 114.

It will be appreciated that the method illustrated in FIGS. 12A and 12B to form the cavity 1204; the method illustrated in FIGS. 13A and 13B to form the cavity 1204; and the method illustrated in FIGS. 14A, 14B, and 14C to form the cavity 1204 result in a similar or substantially same cavity 1204 extending through the second interconnect dielectric layer 120, the second etch stop layer 118, and the one of the dielectric on wire structures 116 and not through the first interconnect dielectric layer 114 in order to expose the upper surface 112u of the one of the first interconnect wires 112.

It will be appreciated that other combinations of wet and dry etching to form the cavity 1204 are also within the scope of the disclosure. Further, in some embodiments, wherein the first opening (1106 of FIG. 11) of the second masking structure (1104 of FIG. 11) is substantially aligned over the underlying first interconnect wire 112, the cavity 1204 may not expose the topmost surface 114t or the sidewall 114s of the first interconnect dielectric layer 114.

The method may proceed from either FIG. 12B, FIG. 13B, or 14C to FIG. 15, in some embodiments.

Figure 15:
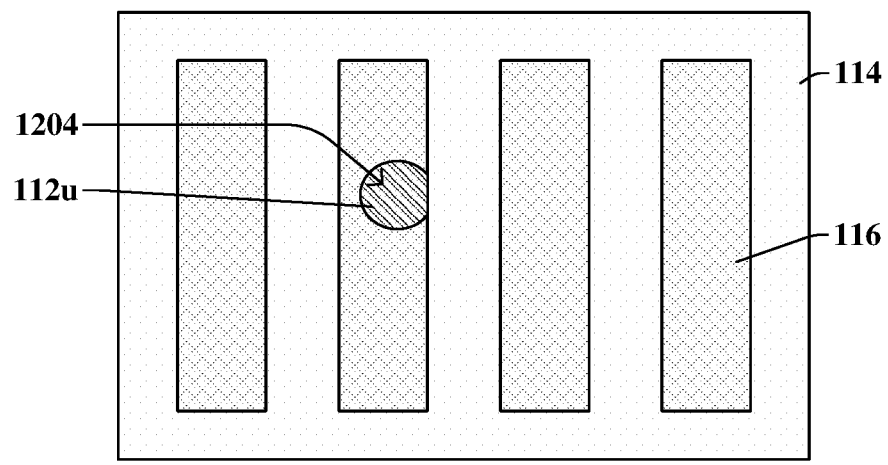

FIG. 15 illustrates a top-view 1500 of some embodiments corresponding to cross-section line AA' of FIG. 12B, 13B, or 14C, respectively.

The top-view 1500 of FIG. 15 illustrates that the cavity 1204 exposes the upper surface 112u of the first interconnect wire (112 of FIG. 14A). Further, it will be appreciated that other cavities (not shown) may have been formed simultaneously with the cavity 1204, such that the other cavities (not shown) expose upper surfaces of other ones of the first interconnect wires (112 of FIG. 14B) arranged beneath the dielectric on wire structures 116.

Figure 16:
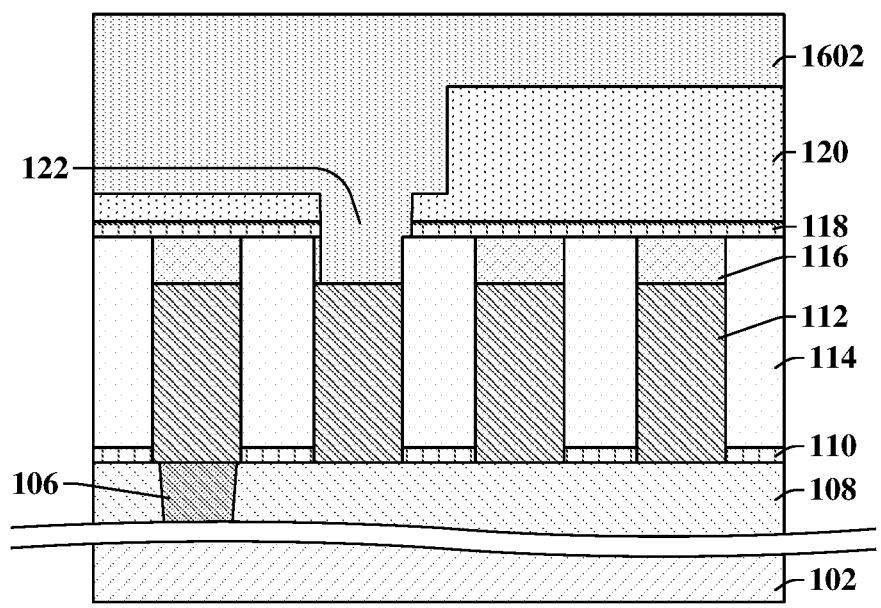

As shown in cross-sectional view 1600 of FIG. 16, in some embodiments, a conductive material 1602 is formed on the second interconnect dielectric layer 120 to completely fill the cavity (1204 of FIG. 14C) in the second interconnect dielectric layer 120, the second etch stop layer 118, and the dielectric on wire structure 116. In such embodiments, an interconnect via 122 may be formed that extends through the second interconnect dielectric layer 120, the second etch stop layer 118, and the dielectric on wire structure 116 to contact one of the first interconnect wires 112. In some embodiments, the conductive material may comprise, for example, tantalum, tantalum nitride, titanium nitride, copper, cobalt, ruthenium, molybdenum, iridium, tungsten, or some other suitable conductive material. Further, in some embodiments, the conductive material 1602 may be formed by way of a deposition process (e.g., PVD, CVD, ALD, spin-on, etc.) in a chamber set to a temperature of between, for example, approximately 150 degrees Celsius and approximately 400 degrees Celsius. In some embodiments, the thickness of the conductive material 1602 may be in a range of between, for example, approximately 10 angstroms and approximately 1000 nanometers.

Figure 17:
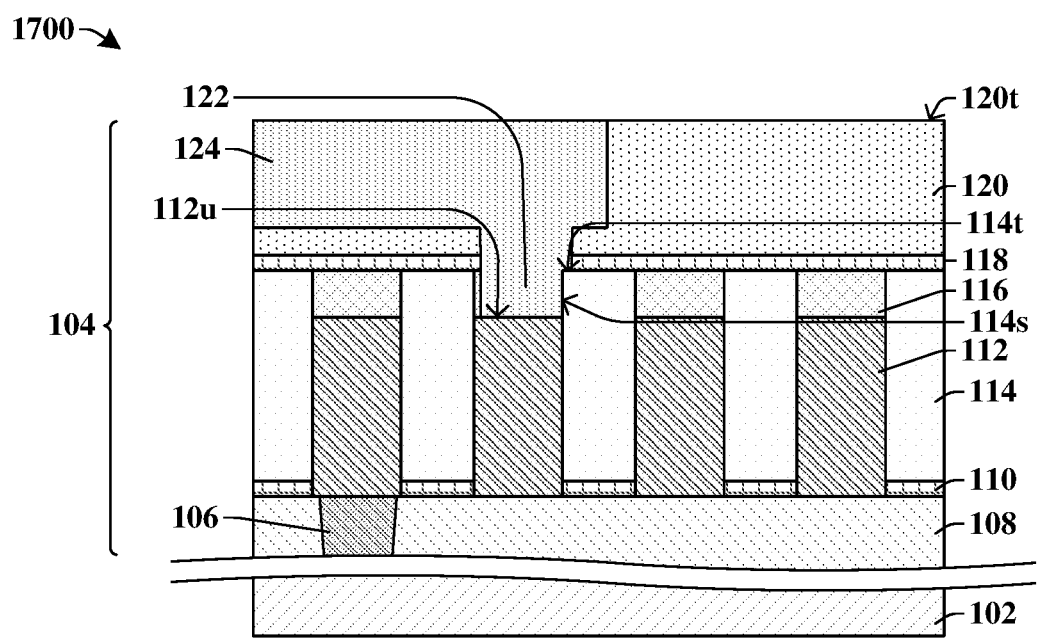

As shown in cross-sectional view 1700 of FIG. 17, in some embodiments, a removal process is performed to remove portions of the conductive material (1602 of FIG. 16) arranged over a topmost surface 120t of the second interconnect dielectric layer 120, thereby forming a second interconnect wire 124 arranged over and coupled to the interconnect via 122. In some embodiments, the removal process comprises a planarization process (e.g., CMP). In some embodiments, the lower interconnect via 106, the first interconnect wires 112, the interconnect via 122, and the second interconnect wire 124 make up an interconnect structure 104 overlying the substrate 102 and providing conductive pathways between various electronic devices (e.g., semiconductor devices, photo devices, memory devices, etc.) arranged above and below the interconnect structure 104.

In some embodiments, at least because the dielectric on wire structures 116 comprise a different material than the first interconnect dielectric layer 114, the first interconnect dielectric layer 114 is not removed during the formation of the cavity (1204 of FIG. 14C) to form the interconnect via 122. In such embodiments, even if the cavity (1204 of FIG. 14C) exposes the first interconnect dielectric layer 114, the interconnect via 122 does not extend into the first interconnect dielectric layer 114. Thus, the interconnect via 122 does not extend below the upper surface 112u of the first interconnect wire 112, and the interconnect via 122 does not extend directly between adjacent ones of the first interconnect wires 112. Thus, the dielectric on wire structures 116 provide a larger processing window for the formation of the interconnect via 122 because even if the interconnect via 122 is misaligned over the first interconnect wire 112, isolation between the first interconnect wires 112 provided by the first interconnect dielectric layer 114 is maintained.

Thus, the dielectric on wire structures 116 increase the processing window for the formation of the interconnect via 122 without sacrificing isolation between underlying first interconnect wires 112 in order to provide a high-performance and reliable integrated chip.

Figure 18:
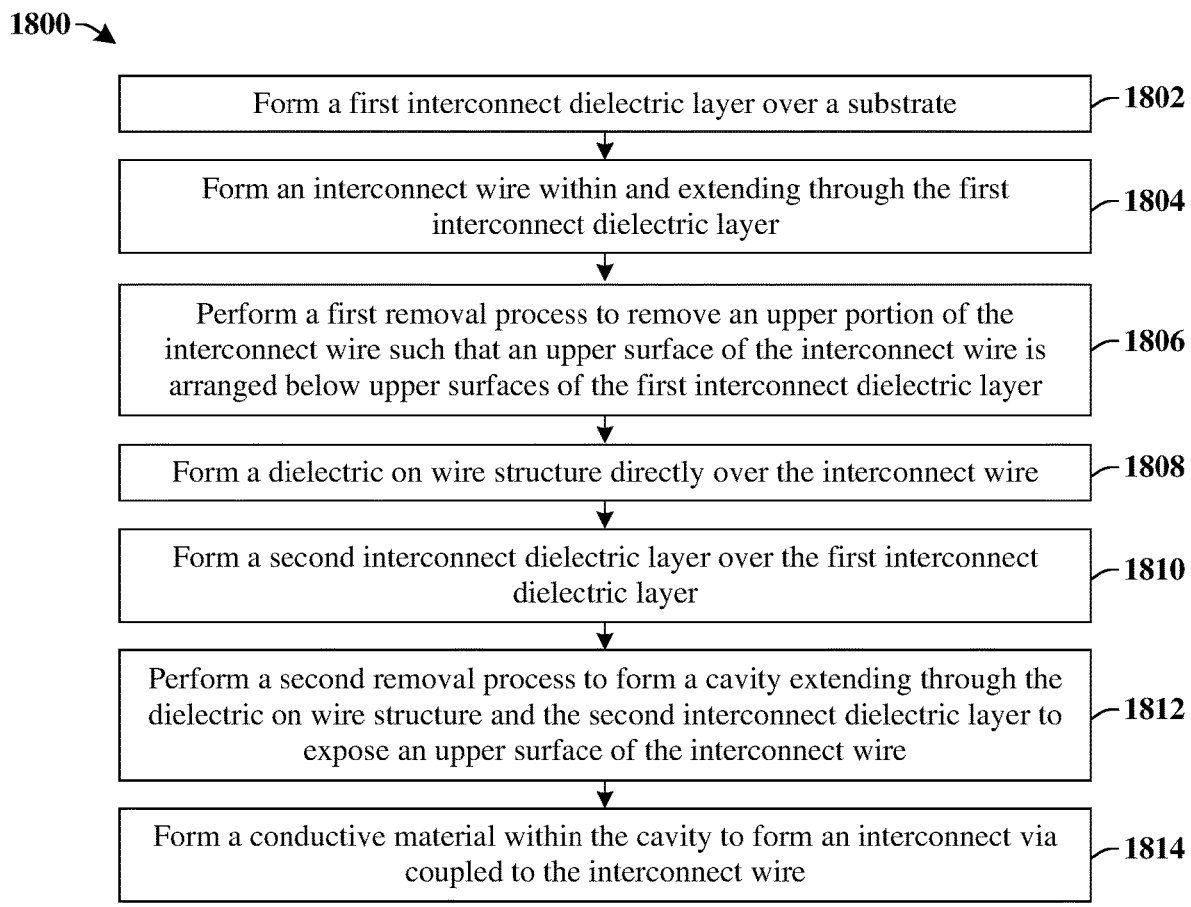
FIG. 18 illustrates a flow diagram of some embodiments corresponding to the method illustrated in FIGS. 4-17.

FIG. 18 illustrates a flow diagram of some embodiments of a method 1800 corresponding to the method illustrated in FIGS. 4-17.

While method 1800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1802, a first interconnect dielectric layer is formed over a substrate.

At act 1804, an interconnect wire is formed within and extending through the first interconnect dielectric layer. FIG. 5 illustrates a cross-sectional view 500 of some embodiments corresponding to acts 1802 and 1804.

At act 1806, a first removal process is performed to remove an upper portion of the interconnect wire such that an upper surface of the interconnect wire is arranged below upper surfaces of the first interconnect dielectric layer. FIG. 6 illustrates a cross-sectional view 600 of some embodiments corresponding to act 1806.

At act 1808, a dielectric on wire structure is formed directly over the interconnect wire. FIG. 7 illustrates a cross-sectional view 700 of some embodiments corresponding to act 1808.

At act 1810, a second interconnect dielectric layer is formed over the first interconnect dielectric layer. FIG. 8 illustrates a cross-sectional view 800 of some embodiments corresponding to act 1810.

At act 1812, a second removal process is performed to form a cavity extending through the dielectric on wire structure and the second interconnect dielectric layer to expose an upper surface of the interconnect wire. FIGS. 12A and 12B respectively illustrate cross-sectional views 1200A and 1200B of some embodiments corresponding to act 1812.

At act 1814, a conductive material is formed within the cavity to form an interconnect via coupled to the interconnect wire. FIG. 17 illustrates a cross-sectional view 1700 of some embodiments corresponding to act 1814.

Therefore, the present disclosure relates to a method of forming an interconnect via over an interconnect wire, wherein a dielectric on wire structure is formed over the interconnect wire to aid in selectively removing portions of the dielectric on wire structure and not a surrounding first interconnect dielectric layer when forming the interconnect via to increase the processing window for the interconnect via.

Accordingly, in some embodiments, the present disclosure relates to an integrated chip comprising: a first interconnect dielectric layer arranged over a substrate; an interconnect wire extending through the first interconnect dielectric layer; a dielectric on wire structure arranged directly over the interconnect wire and having outer sidewalls surrounded by the first interconnect dielectric layer; a second interconnect dielectric layer arranged over the first interconnect dielectric layer; and an interconnect via extending through the second interconnect dielectric layer and the dielectric on wire structure to contact the interconnect wire.

In other embodiments, the present disclosure relates to an integrated chip comprising: a first interconnect dielectric layer arranged over a substrate; a first interconnect wire arranged over the substrate and laterally surrounded by the first interconnect dielectric layer; a second interconnect wire arranged over the substrate, laterally surrounded by the first interconnect dielectric layer, and spaced apart from the first interconnect wire by the first interconnect dielectric layer; a first dielectric on wire structure and a second dielectric on wire structure arranged directly over the first interconnect wire and the second interconnect wire, respectively, wherein the first dielectric on wire structure is spaced apart from the second dielectric on wire structure by the first interconnect dielectric layer; a second interconnect dielectric layer arranged over the first interconnect dielectric layer; and an interconnect via extending through the second interconnect dielectric layer and the first dielectric on wire structure to directly contact the first interconnect wire.

In yet other embodiments, the present disclosure relates to a method comprising: forming a first interconnect dielectric layer over a substrate; forming an interconnect wire within and extending through the first interconnect dielectric layer; performing a first removal process to remove an upper portion of the interconnect wire such that an upper surface of the interconnect wire is arranged below upper surfaces of the first interconnect dielectric layer; forming a dielectric on wire structure directly over the interconnect wire; forming a second interconnect dielectric layer over the first interconnect dielectric layer; performing a second removal process to form a cavity extending through the dielectric on wire structure and the second interconnect dielectric layer to expose an upper surface of the interconnect wire; and forming a conductive material within the cavity to form an interconnect via coupled to the interconnect wire.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first interconnect dielectric layer over a substrate;
   forming an interconnect wire within and extending through the first interconnect dielectric layer;
   performing a first removal process to remove an upper portion of the interconnect wire such that an upper surface of the interconnect wire is arranged below upper surfaces of the first interconnect dielectric layer;
   forming a dielectric on wire structure directly over the interconnect wire;
   forming a second interconnect dielectric layer over the first interconnect dielectric layer;
   performing a second removal process to form a cavity extending through the dielectric on wire structure and the second interconnect dielectric layer to expose an upper surface of the interconnect wire; and forming a conductive material within the cavity to form an interconnect via coupled to the interconnect wire.

2. The method of claim 1, wherein the second removal process comprises one or more etchants, and wherein the first interconnect dielectric layer is substantially resistant to removal by the one or more etchants.

3. The method of claim 1, wherein the cavity exposes an upper surface of the first interconnect dielectric layer.

4. The method of claim 1, further comprising:
forming an etch stop layer over the first interconnect dielectric layer before the forming of the second interconnect dielectric layer.

5. The method of claim 4, wherein the second removal process comprises one or more etchants used to remove the second interconnect dielectric layer, and wherein the etch stop layer is substantially resistant to removal by the one or more etchants.

6. A method comprising:
forming a first interconnect dielectric layer arranged over a substrate;
forming an interconnect wire extending through the first interconnect dielectric layer;
forming a dielectric on wire structure arranged directly over the interconnect wire and having outer sidewalls surrounded by the first interconnect dielectric layer;
forming a second interconnect dielectric layer arranged over the first interconnect dielectric layer; and
forming an interconnect via extending through the second interconnect dielectric layer and the dielectric on wire structure to contact the interconnect wire.

7. The method of claim 6, wherein a bottommost surface of the interconnect via directly contacts an upper surface of the interconnect wire, and wherein an entirety of the bottommost surface of the interconnect via directly overlies the upper surface of the interconnect wire.

8. The method of claim 6, wherein a bottommost surface of the interconnect via has a width that is less than or equal to an upper surface of the interconnect wire.

9. The method of claim 6, wherein the first interconnect dielectric layer comprises a different material than the dielectric on wire structure.

10. The method of claim 6, further comprising:
forming an etch stop layer arranged directly between the first interconnect dielectric layer and the second interconnect dielectric layer and arranged directly between the dielectric on wire structure and the second interconnect dielectric layer.

11. The method of claim 10, wherein the first and second interconnect dielectric layers comprise a same material.

12. The method of claim 6, further comprising:
forming an additional interconnect wire arranged laterally beside the interconnect wire and spaced apart from the interconnect wire by the first interconnect dielectric layer; and
forming an additional dielectric on wire structure arranged directly over the additional interconnect wire and spaced apart from the dielectric on wire structure by the first interconnect dielectric layer.

13. The method of claim 12, wherein the interconnect via is not arranged directly between the interconnect wire and the additional interconnect wire.

14. A method comprising:
forming a first interconnect dielectric layer arranged over a substrate;
forming a first interconnect wire arranged over the substrate and laterally surrounded by the first interconnect dielectric layer;
forming a second interconnect wire arranged over the substrate, laterally surrounded by the first interconnect dielectric layer, and spaced apart from the first interconnect wire by the first interconnect dielectric layer;
forming a first dielectric on wire structure and a second dielectric on wire structure arranged directly over the first interconnect wire and the second interconnect wire, respectively, wherein the first dielectric on wire structure is spaced apart from the second dielectric on wire structure by the first interconnect dielectric layer;
forming a second interconnect dielectric layer arranged over the first interconnect dielectric layer; and
forming an interconnect via extending through the second interconnect dielectric layer and the first dielectric on wire structure to directly contact the first interconnect wire.

15. The method of claim 14, wherein the first dielectric on wire structure and the second dielectric on wire structure have upper surfaces that are substantially planar with an upper surface of the first interconnect dielectric layer.

16. The method of claim 14, wherein the second dielectric on wire structure has a width about equal to the second interconnect wire.

17. The method of claim 14, wherein the interconnect via is arranged completely above the first interconnect wire.

18. The method of claim 14, wherein the first dielectric on wire structure and the second dielectric on wire structure each comprise a different material than the first interconnect dielectric layer.

19. The method of claim 14, wherein a portion of the interconnect via is arranged directly over the first interconnect dielectric layer and comprises a horizontal surface that directly contacts and extends over a topmost surface of the first interconnect dielectric layer.

20. The method of claim 14, further comprising:
forming an etch stop layer arranged over the first interconnect dielectric layer and over the first and second dielectric on wire structures, wherein the etch stop layer separates the first interconnect dielectric layer from the second interconnect dielectric layer.

* * * * *